United States Patent
Lok et al.

(10) Patent No.: US 9,219,492 B1
(45) Date of Patent: Dec. 22, 2015

(54) LOADING-FREE MULTI-STAGE SAR-ASSISTED PIPELINE ADC THAT ELIMINATES AMPLIFIER LOAD BY RE-USING SECOND-STAGE SWITCHED CAPACITORS AS AMPLIFIER FEEDBACK CAPACITOR

(71) Applicant: Hong Kong Applied Science & Technology Research Institute Company Limited, Hong Kong (HK)

(72) Inventors: Chi Fung Lok, Hong Kong (HK); Shiyuan Zheng, Hong Kong (HK)

(73) Assignee: Hong Kong Applied Science & Technology Research Institute Company, Limited, Hong Kong (HK)

( * ) Notice: Subject to any disclaimer, the term of this patent is extended or adjusted under 35 U.S.C. 154(b) by 0 days.

(21) Appl. No.: 14/490,831

(22) Filed: Sep. 19, 2014

(51) Int. Cl.
| | |
|---|---|
| H03M 1/14 | (2006.01) |
| H03M 1/44 | (2006.01) |
| H03M 1/00 | (2006.01) |
| H03M 1/46 | (2006.01) |

(52) U.S. Cl.
CPC .............. *H03M 1/442* (2013.01); *H03M 1/002* (2013.01); *H03M 1/462* (2013.01); *H03M 1/466* (2013.01)

(58) Field of Classification Search
CPC ......... H03M 1/38; H03M 1/44; H03M 1/442; H03M 1/14; H03M 1/145; H03M 1/002
USPC .......................................... 341/161–163, 172
See application file for complete search history.

(56) References Cited

U.S. PATENT DOCUMENTS

| | | | |
|---|---|---|---|
| 6,124,818 A | 9/2000 | Thomas et al. | |
| 6,195,032 B1 | 2/2001 | Watson et al. | |
| 6,879,277 B1 * | 4/2005 | Cai ...................... | H03M 1/164 341/172 |
| 7,265,705 B1 * | 9/2007 | Lee ...................... | H03M 1/145 341/162 |
| 7,741,981 B1 | 6/2010 | Wan et al. | |
| 7,812,757 B1 | 10/2010 | Wong et al. | |
| 7,821,433 B2 * | 10/2010 | Abe .................... | H03M 1/0604 341/118 |
| 7,821,436 B2 | 10/2010 | Setty et al. | |
| 7,884,749 B2 * | 2/2011 | Furuta ................. | H03M 1/1215 341/163 |

(Continued)

OTHER PUBLICATIONS

Boris Murmann and Bernhard E. Boser, "A 12b 75MS/s Pipelined ADC using Open-Loop Residue Amplification", ISSCC, Feb. 2003.

(Continued)

*Primary Examiner* — Howard Williams
(74) *Attorney, Agent, or Firm* — gPatent LLC; Stuart T. Auvinen

(57) ABSTRACT

A multi-stage Successive-Approximation Register (SAR) pipeline Analog-to-Digital Converter (ADC) has an amplifier between two switched capacitor networks, each controlled by a SAR. The load capacitance of the amplifier is magnified due to the amplifier's gain. This magnified load capacitance can disproportionately increase power consumption. The back plates of the second-stage switched capacitors are connected to the amplifier input using a feedback switch during an amplification phase, so that the second-stage switched capacitors are connected between the input and output of the amplifier as a feedback capacitor, rather than a load capacitor. Reset switches are added to drive both plates of the second-stage switched capacitors to ground during a reset phase before the amplification phase. Thus the second-stage switched capacitors function as both the feedback capacitor and as the switched capacitors controlled by the second SAR. Amplifier power is reduced since there is no separate load capacitor during the amplification phase.

20 Claims, 18 Drawing Sheets

(56) References Cited

U.S. PATENT DOCUMENTS

| | | |
|---|---|---|
| 7,978,117 B2 | 7/2011 | Jeon et al. |
| 8,416,107 B1 | 4/2013 | Wan et al. |
| 8,421,658 B1 | 4/2013 | Yau et al. |
| 8,643,520 B1 | 2/2014 | Huo et al. |
| 8,643,529 B2 | 2/2014 | Lin |
| 8,659,461 B1 | 2/2014 | Zhu et al. |

OTHER PUBLICATIONS

C. C. Lee and Michael P. Flynn, "A SAR-Assisted Two-Stage Pipeline ADC", JSSC, vol. 46, No. 4, pp. 859-869, Apr. 2011.

Yan Zhu et. al., "A 50-fJ 10-b 160-MS/s Pipelined-SAR ADC Decoupled Flip-Around MDAC and Self-Embedded Offset Cancellation", JSSC, vol. 47, No. 11, pp. 2614-2026, Nov. 2012.

Young-Deuk Jeon et. al., "A Dual-Channel Pipelined ADC With Sub-ADC Based on Flash-SAR Architecture", TCAS II, vol. 59, No. 11, pp. 741-745, Nov. 2012.

Bob Verbruggen et. al., "A 1.7 mW 11b 250 MS/s 2-Times Interleaved Fully Dynamic Pipelined SAR ADC in 40 nm Digital CMOS", JSSC, vol. 47, No. 12, pp. 2880-2887, Dec. 2012.

Sai-Weng Sin et. al., "An 11b 60MS/s 2.1mW Two-Step Time-Interleaved SAR-ADC with Reused S&H", ESSCIRC, pp. 218-221, Sep. 2010.

Lane Brooks and Hae-Seung Lee, "A 12b, 50 MS/s, Fully Differential Zero-Crossing Based Pipelined ADC", JSSC, vol. 44, No. 12, pp. 3329-3343, Dec. 2009.

Sunghyuk Lee et. al., "A 12 b, 5-to-50 MS/s 0.5-to-1 V Voltage Scalable Zero-Crossing Based Pipelined ADC", JSSC, vol. 47, No. 7, pp. 1603-1613, Jul. 2012.

\* cited by examiner

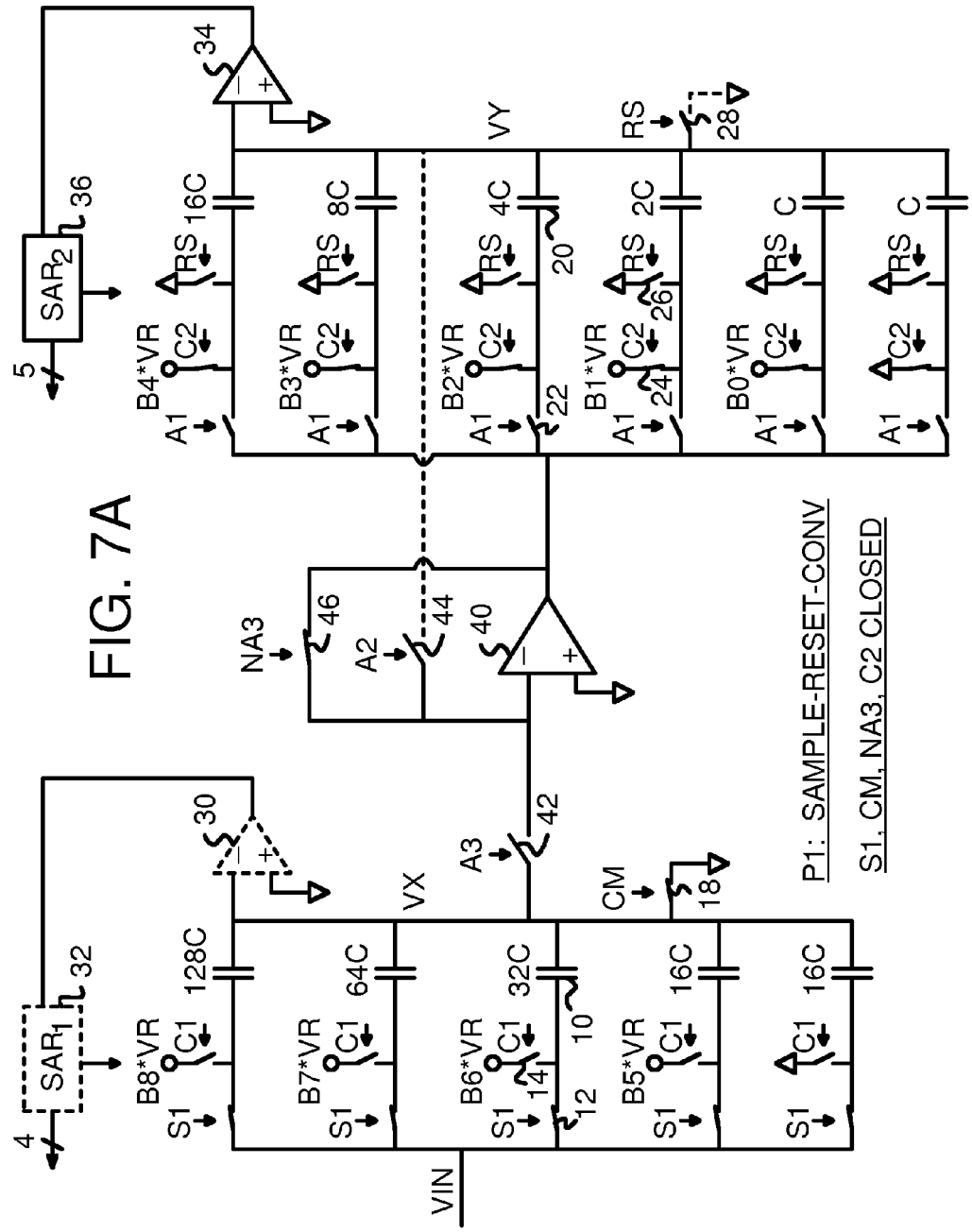

P1: SAMPLE-RESET-CONV
NA3, C2 CLOSED

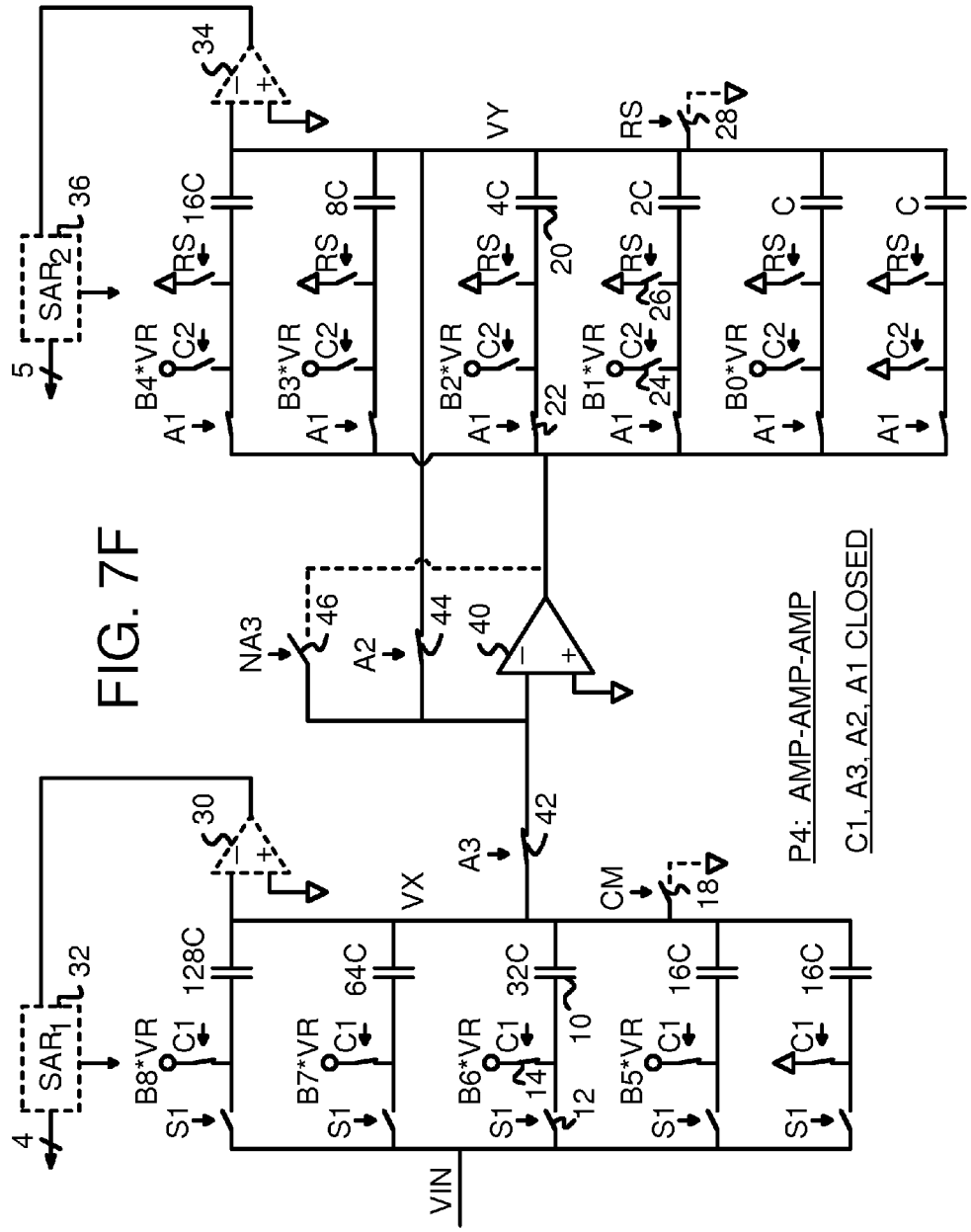

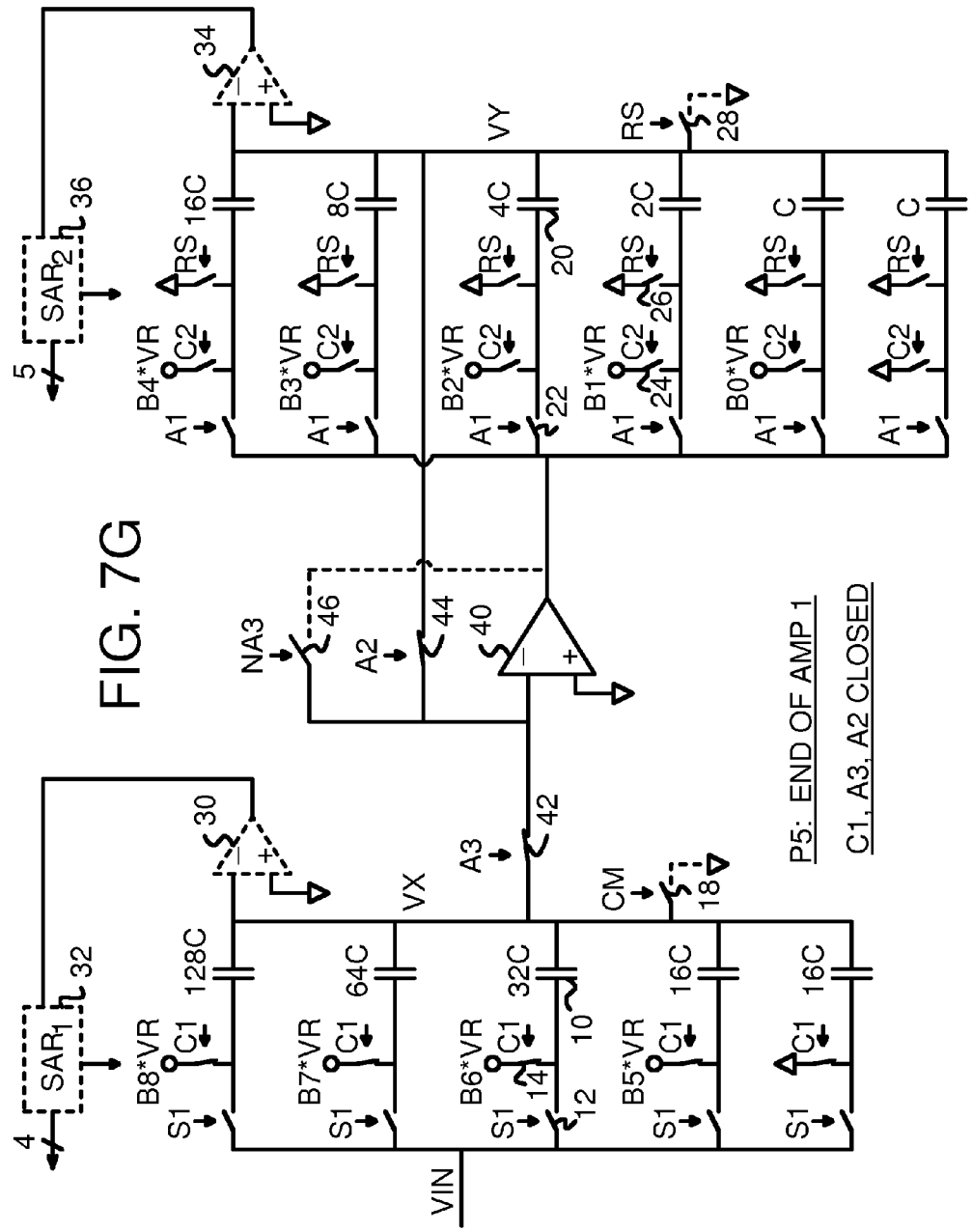

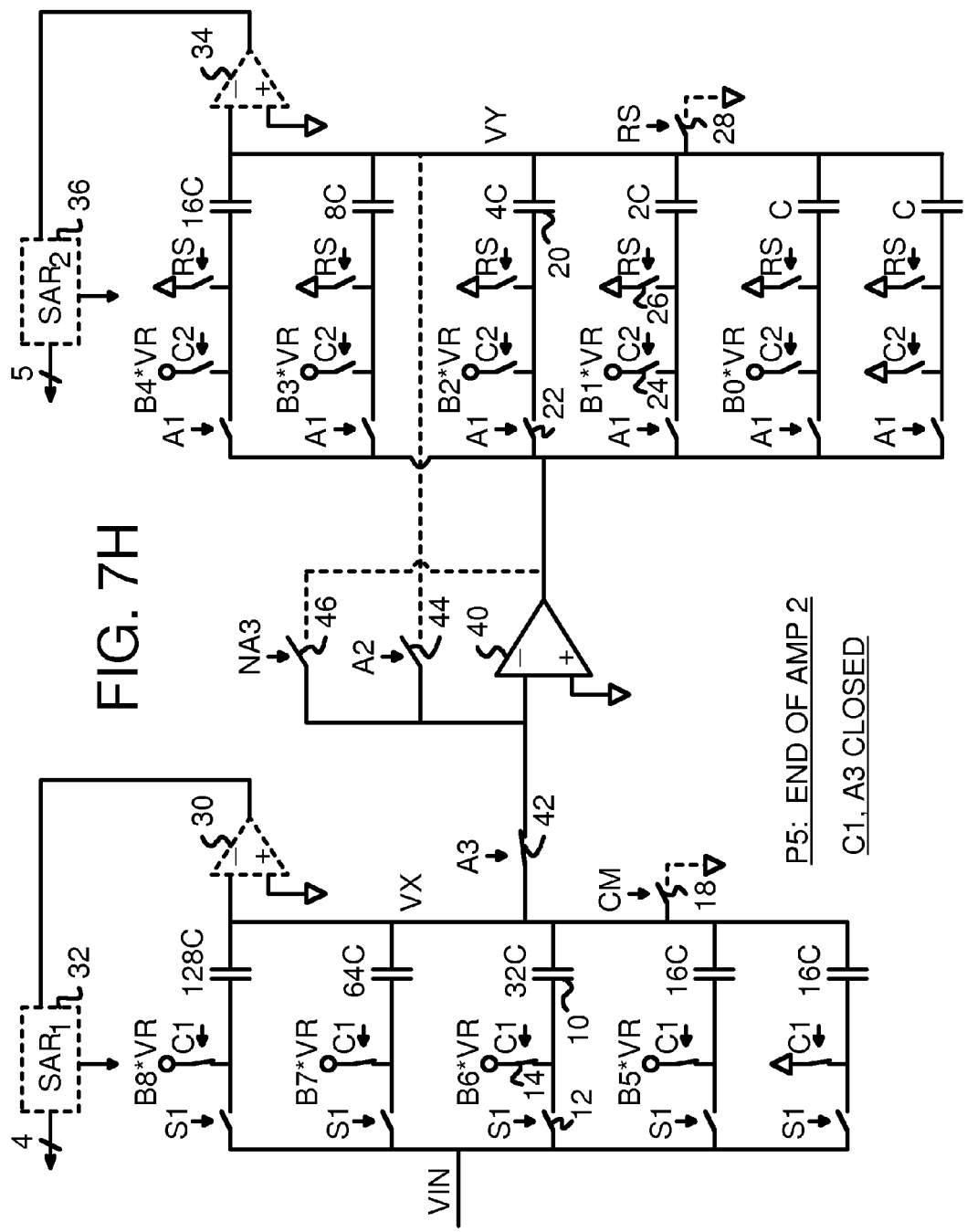

P5: END OF AMP 3
C1, A3 NA3 CLOSED

LOADING-FREE MULTI-STAGE SAR-ASSISTED PIPELINE ADC THAT ELIMINATES AMPLIFIER LOAD BY RE-USING SECOND-STAGE SWITCHED CAPACITORS AS AMPLIFIER FEEDBACK CAPACITOR

FIELD OF THE INVENTION

This invention relates to analog-to-digital converters (ADC's), and more particularly to multi-stage Successive-Approximation Register (SAR) ADCs.

BACKGROUND OF THE INVENTION

Many kinds of Analog-to-Digital Converters (ADC's) have been used for a wide variety of applications. Flash ADC's compare analog signal voltages to multiple voltage levels in an instant to produce a multi-bit digital word that represents the analog voltage. Successive-approximation ADC's use a series of stages to convert an analog voltage to digital bits. Each stage compares an analog voltage to a reference voltage, producing one digital bit. In sub-ranging ADC's, each stage compares an analog voltage to several voltage levels, so that each stage produces several bits. Succeeding stages generate lower-significant digital bits than do earlier stages in the pipeline.

Algorithmic, re-circulating, or recycling ADC's use a loop to convert an analog voltage. The analog voltage is sampled and compared to produce a most-significant digital bit. Then the digital bit is converted back to analog and subtracted from the analog voltage to produce a residue voltage. The residue voltage is then multiplied by two and looped back to the comparator to generate the next digital bit. Thus the digital bits are generated over multiple cycles in the same comparator stage.

FIG. 1 shows a Successive-Approximation-Register ADC. Successive-Approximation-Register SAR 102 receives a clock CLK and contains a register value that is changed to gradually zero-in on a close approximation of the analog input voltage VIN. For example, the value in SAR 102 may first be 0.5, then 0.25, then 0.375, then 0.312, then 0.281, then 0.296, then 0.304, then 0.308, then 0.31, then 0.311, and finally 0.312 when comparing to a VIN of 0.312 volts. SAR 102 outputs the current register value to digital-to-analog converter (DAC) 100, which receives a reference voltage VREF and converts the register value to an analog voltage VA.

The input analog voltage VIN is applied to sample-and-hold circuit 104, which samples and holds the value of VIN. For example, a capacitor can be charged by VIN and then the capacitor isolated from VIN to hold the analog voltage. The sampled input voltage from sample-and-hold circuit 104 is applied to the inverting input of comparator 106. The converted analog voltage VA is applied to the non-inverting input of comparator 106.

Comparator 106 compares the converted analog voltage VA to the sampled input voltage and generates a high output when the converted analog voltage VA is above the sampled VIN, and the register value in SAR 102 is too high. The register value in SAR 102 can then be reduced.

When the converted analog voltage VA is below the sampled input voltage, comparator 106 generates a low output to SAR 102. The register value in SAR 102 is too low. The register value in SAR 102 can then be increased for the next cycle.

The register value from SAR 102 is a binary value of N bits, with D(N−1) being the most-significant-bit (MSB) and D0 being the least-significant-bit (LSB). SAR 102 can first set the MSB D(N−1), then compare the converted analog voltage VA to the input voltage VIN, then adjust the MSB and/or set the next MSB D(N−2) based on the comparison. The set and compare cycle repeats until after N cycles the LSB is set. After the last cycle, the end-of-cycle EOC signal is activated to signal completion. A state machine or other controller can be used with or included inside SAR 102 to control sequencing.

DAC 100 or sample-and-hold circuit 104 may have an array of capacitors. The capacitors have binary-weighted values, such as 1, 2, 4, 8, 16, 32, . . . times a unit size capacitor. For example, a 6-bit DAC may have an array of capacitors of 1, 2, 4, 8, 16, 32 times a unit capacitance C. Higher-resolution DAC's such as a 11-bit DAC have much larger capacitor values, such as $2^{N-1}=1024$.

While such capacitor-array DAC's are useful, the large size of the unit capacitance C requires a large amount of charge to be transferred, increasing power consumption. The minimum size of the unit capacitance C is defined by the noise and linearity requirement of the ADC specification.

FIG. 2 is a graph showing a SAR ADC resolving an input voltage. The register value in SAR 102 is initially set to one-half, or 10000. Comparator 106 determines that the input voltage VIN is less than the converted value from SAR 102, so in the next iteration SAR 102 is set to one-quarter, or 01000. Comparator 106 determines that the input voltage VIN is greater than the converted value from SAR 102, so in the third iteration SAR 102 is set to three-eighths, or 01100. Comparator 106 determines that the input voltage VIN is less than the converted value from SAR 102 in the third iteration, so in the fourth iteration SAR 102 is set to five-sixteenths, or 01010. Now comparator 106 determines that the input voltage VIN is greater than the converted value from SAR 102, so in the fifth iteration SAR 102 is set to 9/32, or 01011. The final comparison is that VIN is above the converted value, so the final result is 01011.

SAR ADCs are limited in speed due to their serial decision making process. Furthermore, the effective resolution of SAR ADCs is limited by comparator noise and limited capacitor matching. A multi-stage SAR pipeline ADC may increase the ADC conversion rate and resolution. By dividing the conversion bits into several stages, the SAR conversion cycle can be shortened. Moreover, pipelining operations among stages may increase the ADC's throughput.

An op amp may be used between the stages to amplify the residual voltage from the first stage before input to the second stage. After SAR conversion, the residual voltage of the first stage is amplified and sent to the second stage, relaxing requirements of the comparator in the following stage.

The switched capacitors in the second stage act as a load on the first stage in conjunction with the feedback capacitor on the op amp between the first and second stages. Power is consumes when capacitors are charged and discharged. Thus reducing capacitance is desirable to reduce power consumption, as well as area and cost.

What is desired is a multi-stage SAR-assisted pipeline ADC. A multi-stage SAR-assisted pipeline ADC with lower power consumption is desired. A multi-stage SAR-assisted pipeline ADC that re-uses capacitors for multiple purposes is desirable to reduce effective loading and power consumption.

BRIEF DESCRIPTION OF THE DRAWINGS

FIGS. 7A-I show phase of operation of the two-stage SAR-assisted pipeline ADC with loading-free residue transfer.

DETAILED DESCRIPTION

The present invention relates to an improvement in multi-stage pipelined Successive-Approximation Register (SAR) analog-to-digital converters (ADC's). The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 3:
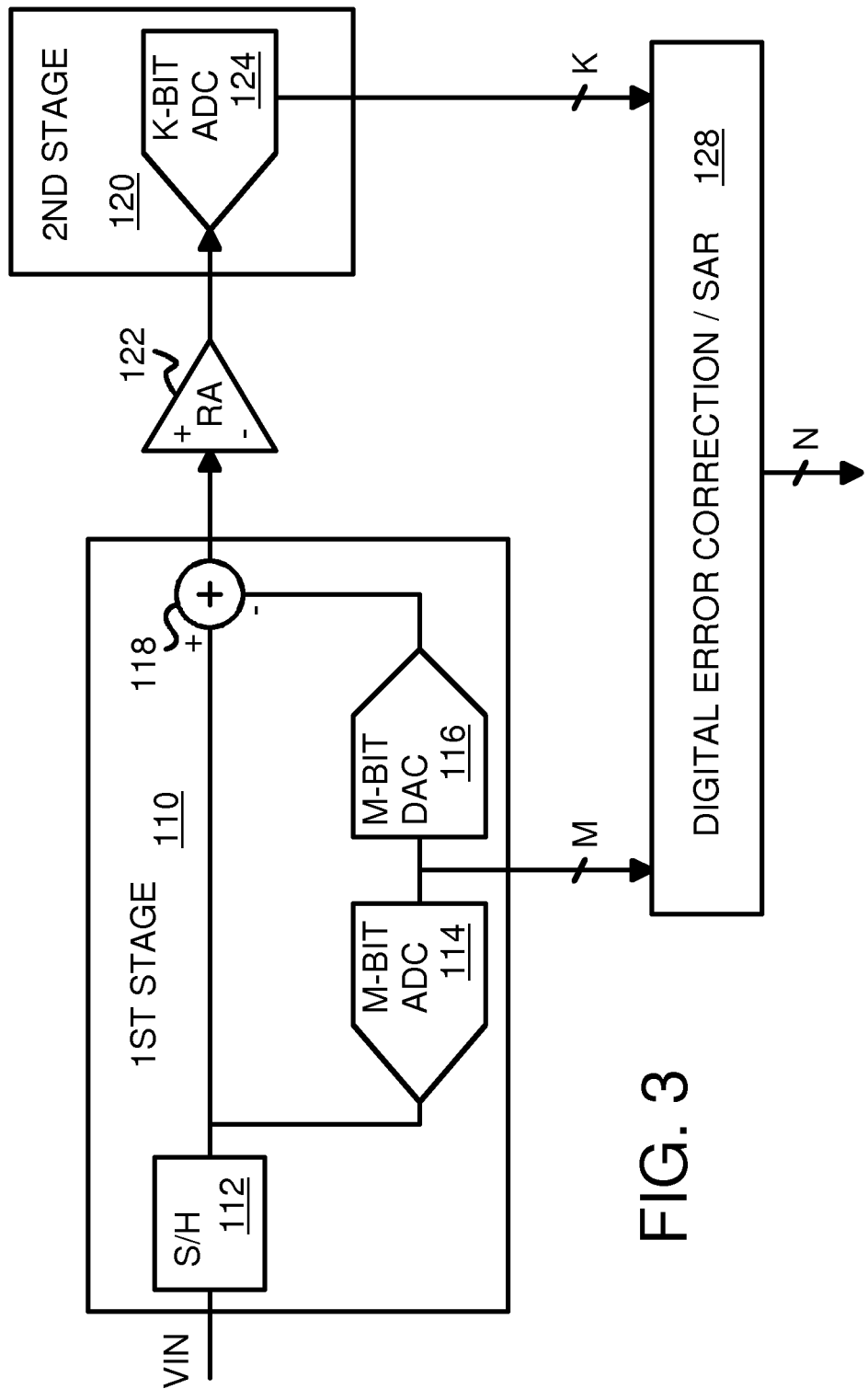
FIG. 3 shows a multi-stage SAR-assisted pipeline ADC.

FIG. 3 shows a multi-stage SAR-assisted pipeline ADC. An input voltage VIN is applied to sample and hold circuit 112 in first stage 110. M-bit ADC 114 then converts the sampled voltage to an M-bit value that is stored in SAR 128. The M-bit value stored is converted back to an analog voltage by DAC 116 and subtracted from the sampled input voltage by subtractor 118 to generate a residual voltage. The residual voltage is amplified by residual amplifier 122 and sent to second stage 120.

The amplified residual voltage is converted to a K-bit digital value by K-bit ADC 124 in second stage 120. The K bits from second stage 120 and the M bits from first stage 110 are combined in SAR 128 to generate an N-bit digital value that represents VIN.

SAR 128 controls the ADCs, amplifier, and other circuits. SAR 128 may act to correct digital errors. There may be some overlap between the M and K bits. For example, N may be 1 less than M+K, so that there is a redundant bit. Conversion by the first stage may occur at the same time as conversion by the second stage, but for different analog samples. When conversion ends in both stages, the amplifier can transfer the residual from the first stage to the second stage.

The blocks in FIG. 3 are conceptual. An actual circuit implementation of first stage 110, second stage 120, and residual amplifier 122 are shown in FIG. 4.

Figure 4:
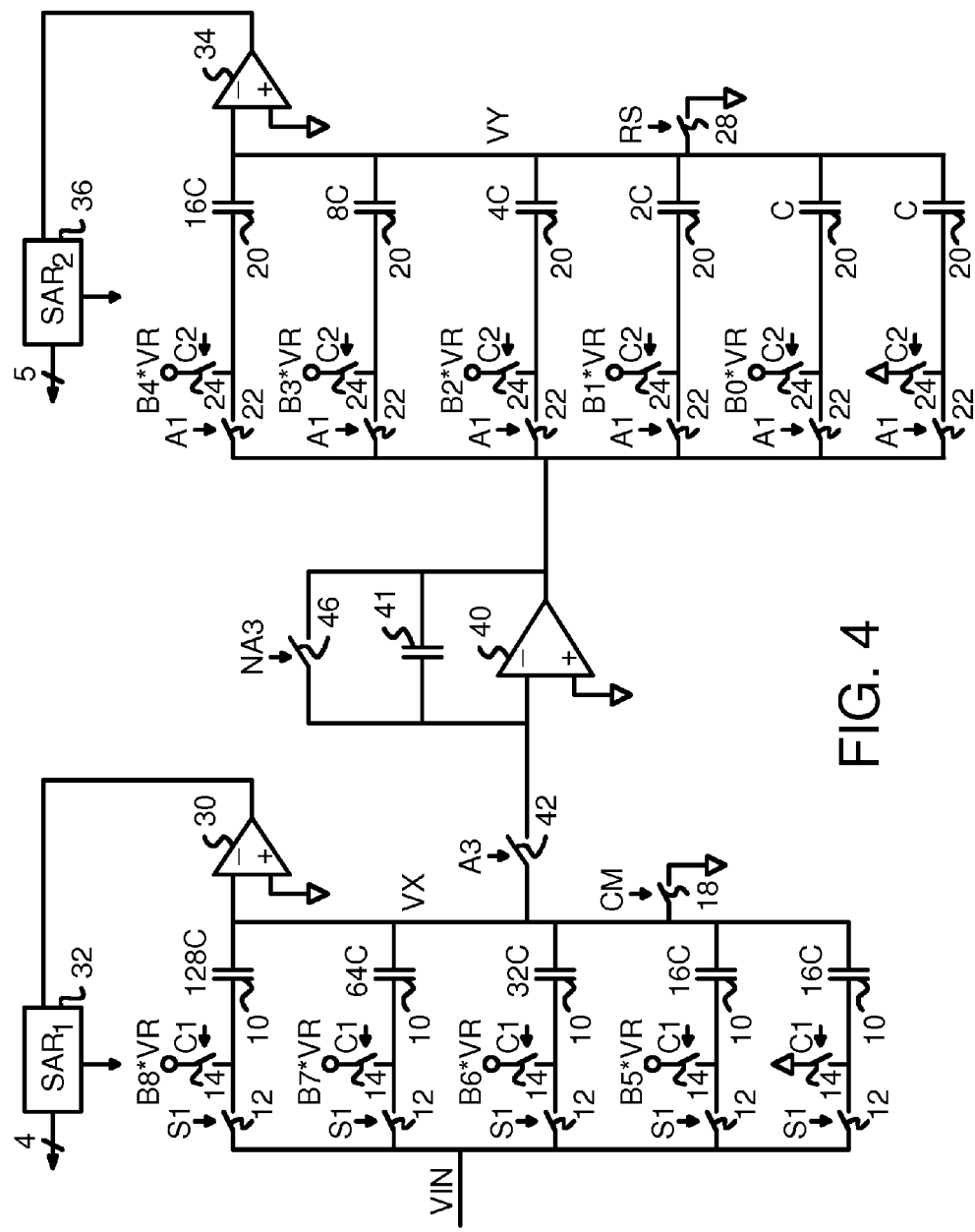
FIG. 4 shows a 2-stage SAR-assisted pipeline ADC using an op amp with a feedback capacitor between the stages.

FIG. 4 shows a 2-stage SAR-assisted pipeline ADC using an op amp with a feedback capacitor between the stages. Input voltage VIN is applied to first-stage switched capacitors 10 through switches 12 when closed by signal S1. Back switch 18 closes during sampling to keep the back plates of first-stage switched capacitors 10 grounded.

Figure 1:
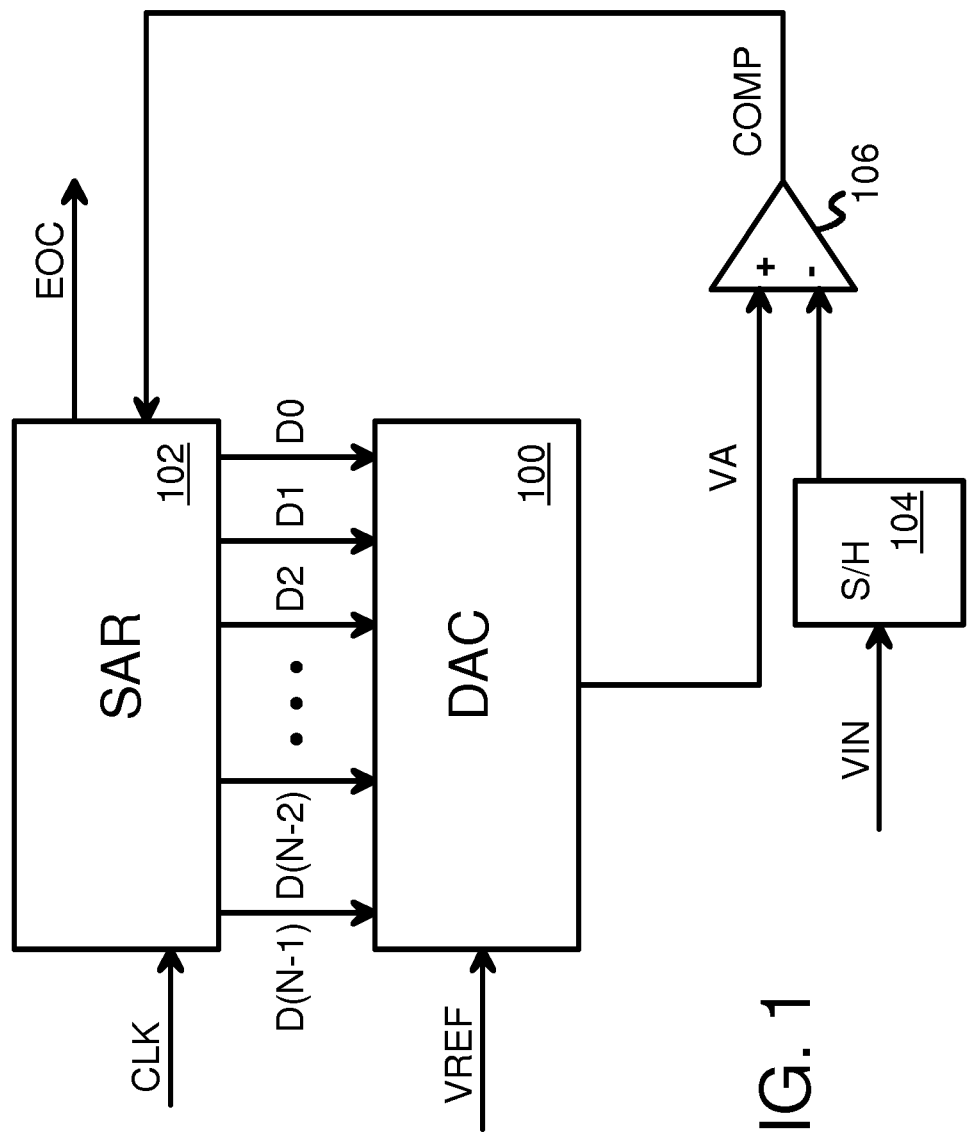
FIG. 1 shows a Successive-Approximation-Register ADC.
Figure 2:
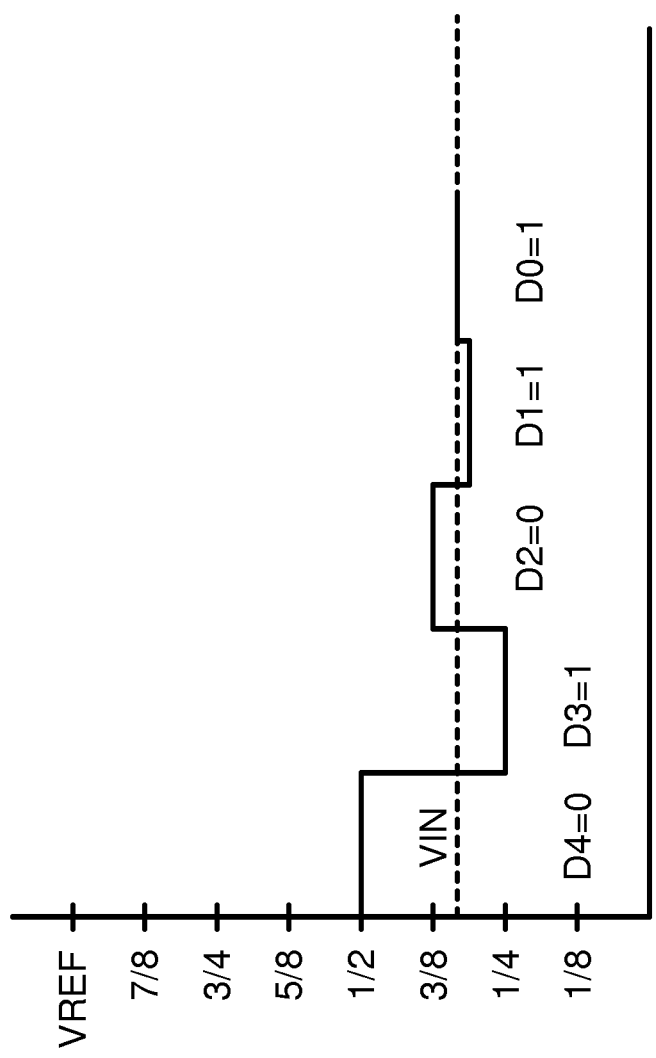
FIG. 2 is a graph showing a SAR ADC resolving an input voltage.

During conversion, switches 12, 18 open and switches 14 close. The back plate of first-stage switched capacitors 10, node VX, is applied to comparator 30, which provides first-stage SAR 32 with feedback. The 4-bit digital value (B8:B5) in first-stage SAR 32 is gated with a reference voltage VR and switched through switches 14 to the front sides of first-stage switched capacitors 10. As the digital value in first-stage SAR 32 changes, different ones of first-stage switched capacitors 10 are switched between reference voltage VR and ground through switches 14. This causes VX to change due to capacitive coupling, and the voltage on VX is compared by comparator 30 and fed back to first-stage SAR 32. Thus various digital values may be successively tested by first-stage SAR 32 until a best match is found, such as shown by the graph of FIG. 2.

Once first-stage SAR 32 has found the digital values B8:B5 that best fit VIN, the residual voltage on VX is amplified by op amp 40 and applied through switches 22 to the front plates of second-stage switched capacitors 20. Signals A1, A3, RS are active, closing switches 22, 42, 28. After amplification is complete, another conversion phase occurs for the second stage.

During second-stage conversion, switches 22, 28 open and switches 24 close. The back plate of second-stage switched capacitors 20, node VY, is applied to comparator 34, which provides second-stage SAR 36 with feedback. The 5-bit digital value (B4:B0) in second-stage SAR 36 is gated with a reference voltage VR and switched through switches 24 to the front sides of second-stage switched capacitors 20. As the digital value in second-stage SAR 36 changes, different ones of second-stage switched capacitors 20 are switched between reference voltage VR and ground through switches 24. This causes VY to change due to capacitive coupling, and the voltage on VY is compared by comparator 34 and fed back to second-stage SAR 36.

Since the residual voltage from the first stage is amplified before being applied to the second stage, different smallest size capacitors can be used for each stage. The sizes of first-stage switched capacitors 10 can be binary-weighted with the smallest two capacitors being a minimum size capacitor of capacitance 16C. However, sizes of second-stage switched capacitors 20 can be binary-weighted with the smallest two capacitors being a minimum size capacitor of capacitance C. Different ratios of the smallest-size capacitors in the two stages may be used besides the 16:1 ratio shown in the example. The total capacitance of the first stage capacitors (CS1) may be chosen according to the noise and linearity requirement of the ADC. Since the residual voltage of the first stage has been amplified, the noise and nonlinearity from the second stage will be suppressed when they are referred to the ADC input. As a result, the total capacitance of the second stage capacitors (CS2) is normally chosen to be CS1 divided by the gain of the amplification.

The final digital value combines the 4 bits from first-stage SAR 32 as the MSB's and the 5 bits from second-stage SAR 36 as the LSB's.

Figure 5:
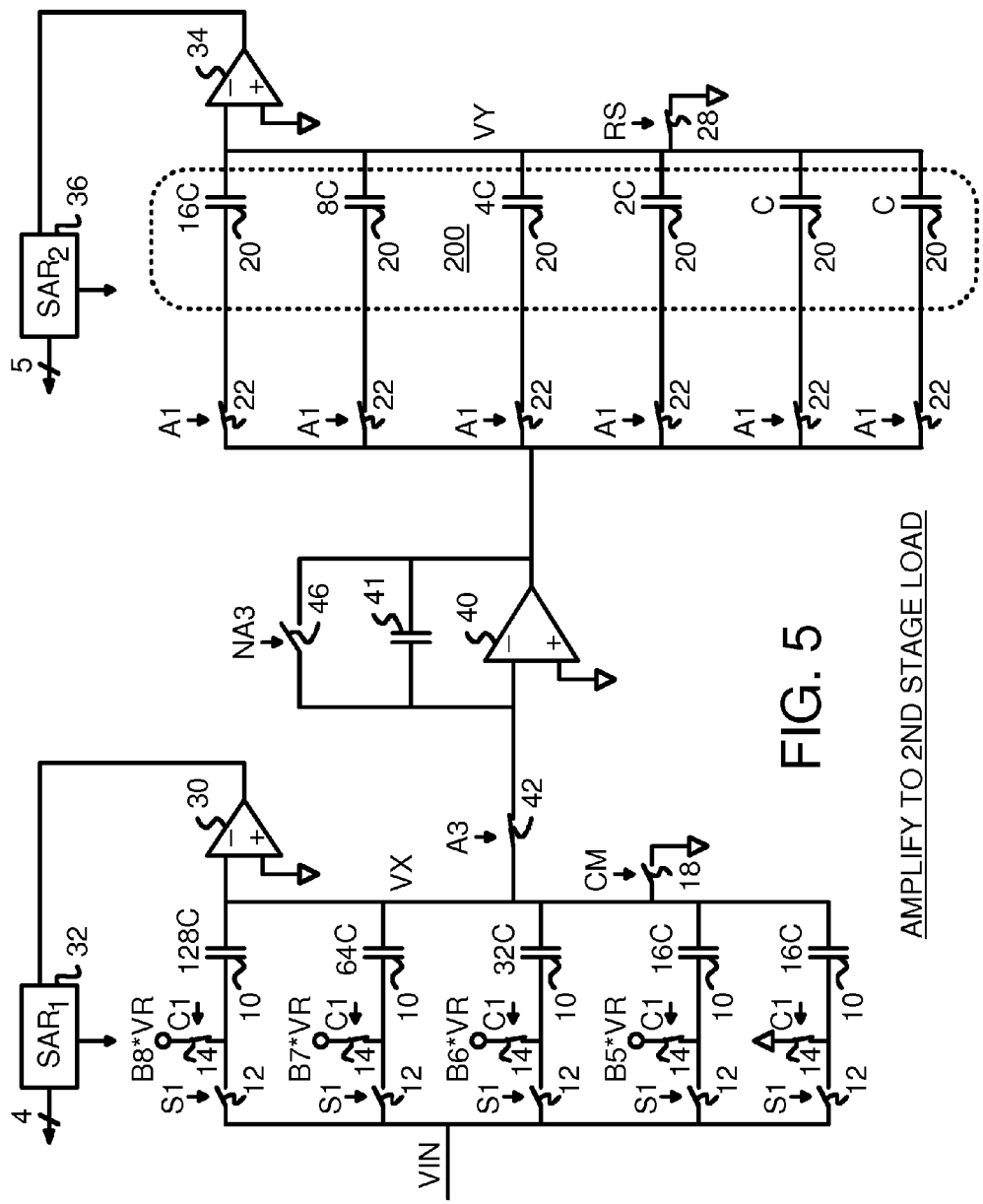
FIG. 5 highlights amplification between stages in more detail.

FIG. 5 highlights amplification between stages in more detail. During the amplification phase, switches 14 drive the final value from first-stage SAR 32 to the front side of first-stage switched capacitors 10 while the back side, node VX, passes through switch 42 to the inverting input op amp 40. Switch 46 is open. The output of op amp 40 drives second-stage switched capacitors 20 through switches 22. The back sides of second-stage switched capacitors 20, node VY, is grounded by switch 28.

Second-stage switched capacitors 20 together act as load capacitor 200 on the output of op amp 40. First-stage switched capacitors 10 and feedback capacitor 41 determine the gain or amount of amplification by op amp 40. The gain can be approximated as CS1/CFB, where CS1 is the total capacitance of first-stage switched capacitors 10, and CFB is the capacitance of feedback capacitor 41.

For example, first-stage switched capacitors 10 may total 4 pF, while feedback capacitor 41 is 0.5 Pf, and the parasitic op-amp input capacitance is negligible. Then the gain is 4/0.5=8, and the feedback factor, 1/(1+G)=⅑. The feedback factor indicates the equivalent capacitance of load capacitor 200 at the first-stage input VIN. Thus a 0.5 pF total capacitance for second-stage switched capacitors 20 is equivalent to a 9×0.5=4.5 pF equivalent input capacitance due to magnification of the load by op amp 40. A higher equivalent input capacitance is undesirable because the amplifier consumes more power.

The power consumed by op amp 40 increases as its equivalent input load increases. Since the equivalent input load increases at a much higher rate as load capacitor 200 increases, power consumption is especially sensitive to load capacitor 200.

The inventors have realized that reducing or eliminating load capacitor 200 could significantly reduce the power consumed by op amp 40. The inventors have discovered that load capacitor 200 may be effectively eliminated by using second-stage switched capacitors 20 as feedback capacitor 41 during amplification. Once the amplification phase is over, second-stage switched capacitors 20 are used for conversion. Thus second-stage switched capacitors 20 act as both feedback capacitor 41 and as second-stage switched capacitors 20.

During the amplification phase, second-stage switched capacitors 20 are connected to op amp 40 in the same manner that feedback capacitor 41 was. However, since second-stage switched capacitors 20 are connected where feedback capacitor 41 was, there is no longer a load capacitor 200. Thus the load on op amp 40 has been reduced to zero. Since op amp 40 has a near-zero load, its power consumption is significantly reduced.

Figure 6:
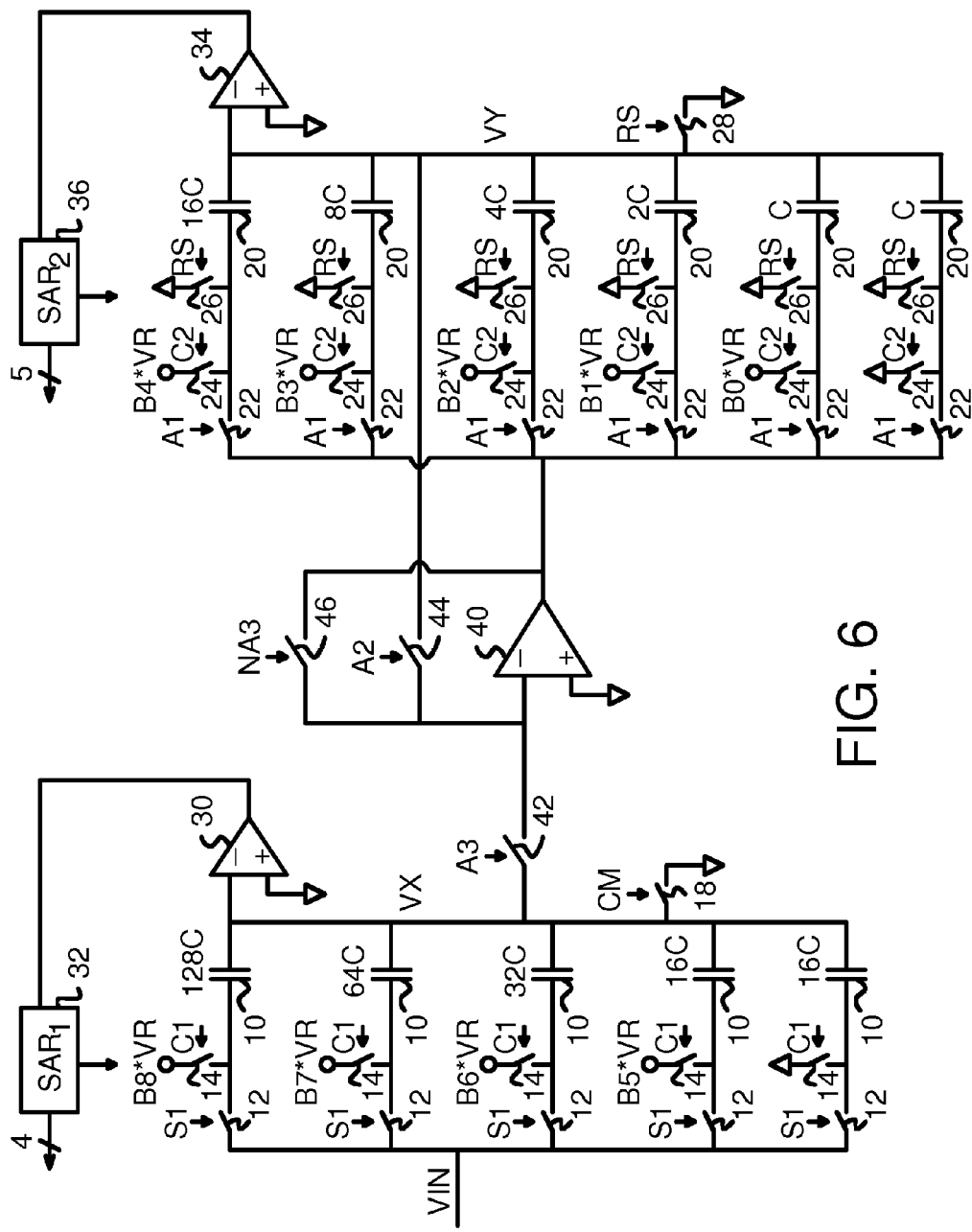
FIG. 6 shows a two-stage SAR-assisted pipeline ADC with loading-free residue transfer.

FIG. 6 shows a two-stage SAR-assisted pipeline ADC with loading-free residue transfer. Feedback capacitor 41 has been eliminated. Instead, second-stage switched capacitors 20 are connected as the feedback capacitor by feedback switch 44 when signal A2 is active during the amplify phase. The other side of second-stage switched capacitors 20 are connected to the output of op amp 40 by switches 22, which are also closed during the amplify phase.

Second-stage switched capacitors 20 are connected by feedback switch 44 to the input of op amp 40 and by switches 22 to the output of op amp 40. Therefore second-stage switched capacitors 20 are connected exactly as feedback capacitor 41 of FIG. 5. Second-stage switched capacitors 20 act as feedback capacitor 41 during the amplify phase. There is no load capacitor connected to op amp 40 since neither terminal of second-stage switched capacitors 20 is connected to ground as all of switches 24, 26, 28 are open during the amplify phase. Since there is no load capacitor, only a feedback capacitor, power consumption by op amp 40 is reduced.

During conversion, the binary MSB's from first-stage SAR 32 are gated with reference voltage VR through switches 14 and applied to first-stage switched capacitors 10, while binary LSB's from second-stage SAR 36 are gated with reference voltage VR through switches 24 and applied to second-stage switched capacitors 20. Comparator 30 compares first summing node VX with a reference such as ground and feeds back to first-stage SAR 32. Comparator 34 compares second summing node VY with a reference such as ground and feeds back to second-stage SAR 36.

VIN is sampled to first-stage switched capacitors 10 through sampling switches 12. VX is grounded by grounding switch 18 and VY is grounded by grounding switch 28. The front plates of second-stage switched capacitors 20 are reset to ground by reset switches 26.

During amplification, when second-stage switched capacitors 20 act as the feedback capacitor, switches 42, 44, 22 close. To reset or zero op amp 40, switches 42, 44 open and zeroing switch 46 closes.

Figure 7B:
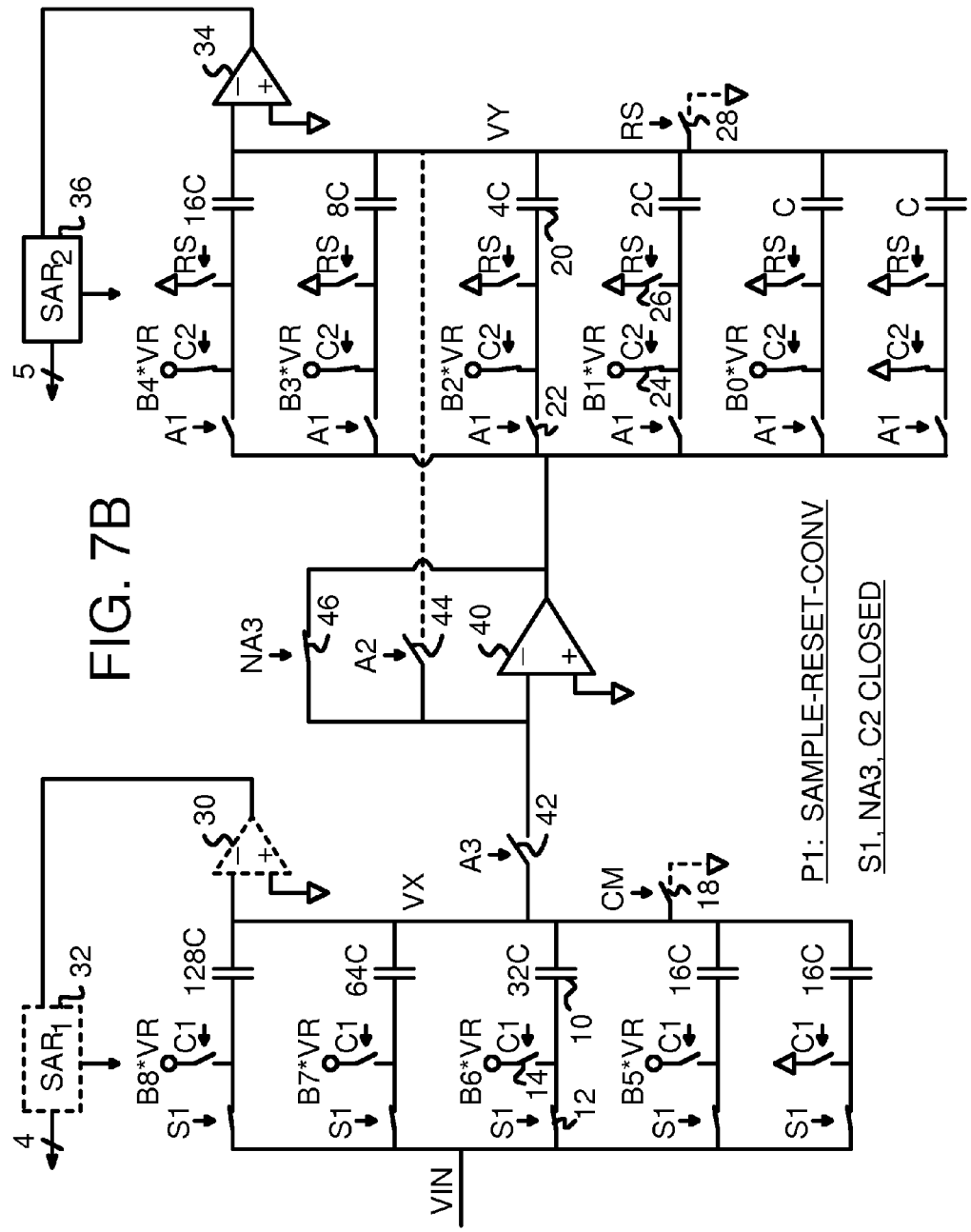

FIGS. 7A-I show phase of operation of the two-stage SAR-assisted pipeline ADC with loading-free residue transfer. Dashed lines show components or signal paths that are not used during the phases shown. Each phase P1, P2, P3 . . . can be identified by the operation being performed in each of the three main blocks: stage 1 SAR-ADC, the residual amplifier, and stage two SAR-ADC. In FIG. 7A, phase 1 (P1) has the first stage sampling, the amplifier resetting, and the second stage converting. In FIG. 7F, all stages are configured for amplifying.

In FIG. 7A, phase P1 has switches 12 closed by S1 to sample VIN to the front plates of first-stage switched capacitors 10. Switches 14 remain open, and comparator 30 and first-stage SAR 32 are not examining VX. Switches 42, 44, 22 are open and zeroing switch 46 closed, connecting together the input and output of op amp 40 so that any offset error is stored on the parasitic capacitance on the op-amp input.

In the second stage, conversion may occur. Reset switches 26, 28 are open and second-stage SAR 36 can drive different binary values of B4:B0 to be gated with reference voltage VR through switches 24 to the front plates of second-stage switched capacitors 20 to test different digital values using comparator 34. Switch 18 is closed, driving VX to ground during sampling in the first stage.

In FIG. 7B, phase P1 continues. Signal CM turns off, opening switch 18. This allows first summing node VX to float.

Figure 7C:
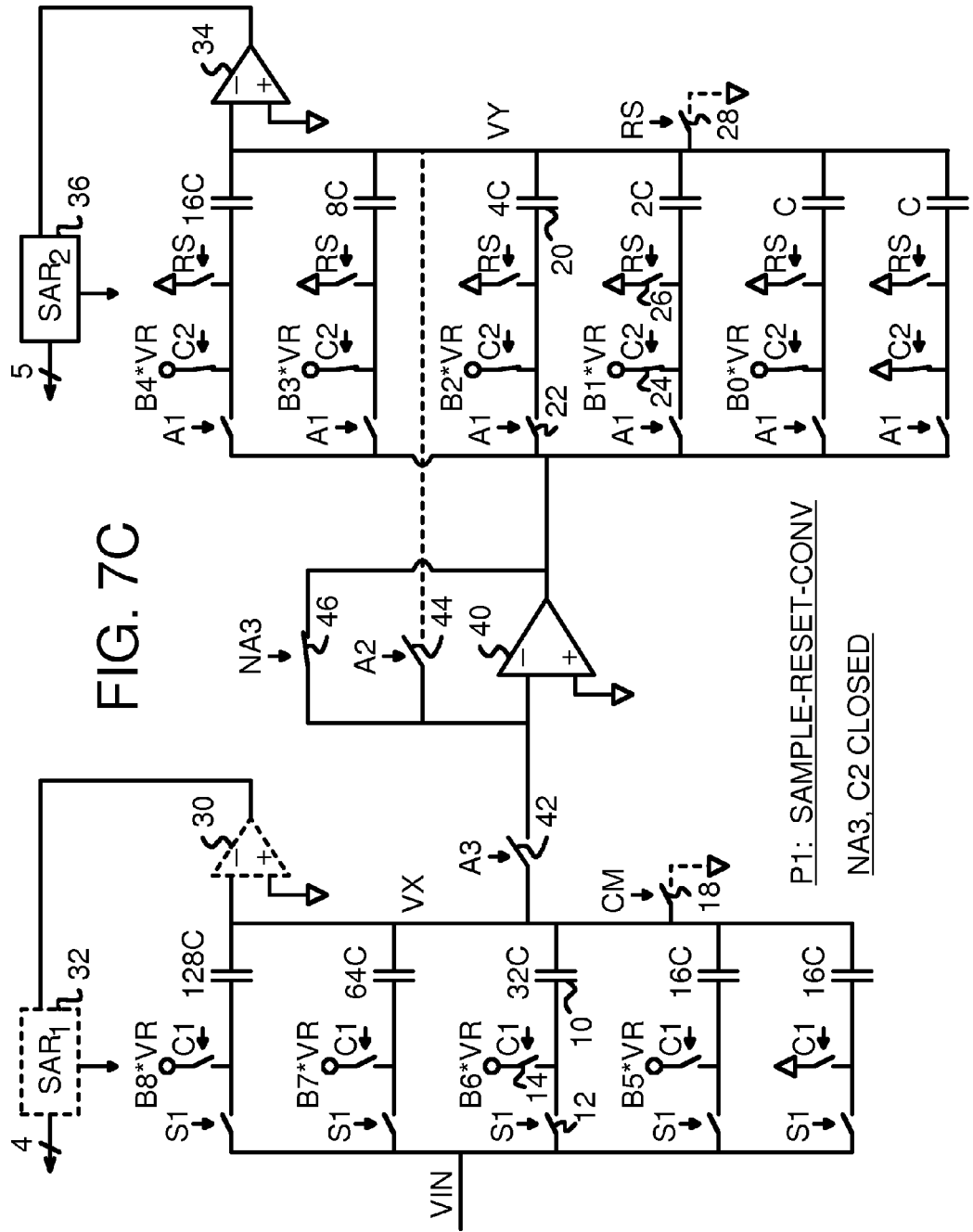

In FIG. 7C, phase P1 continues. Sampling signal S1 also turns off, opening switches 12. This allows the front plates of first-stage switched capacitors 10 to float.

Figure 7D:
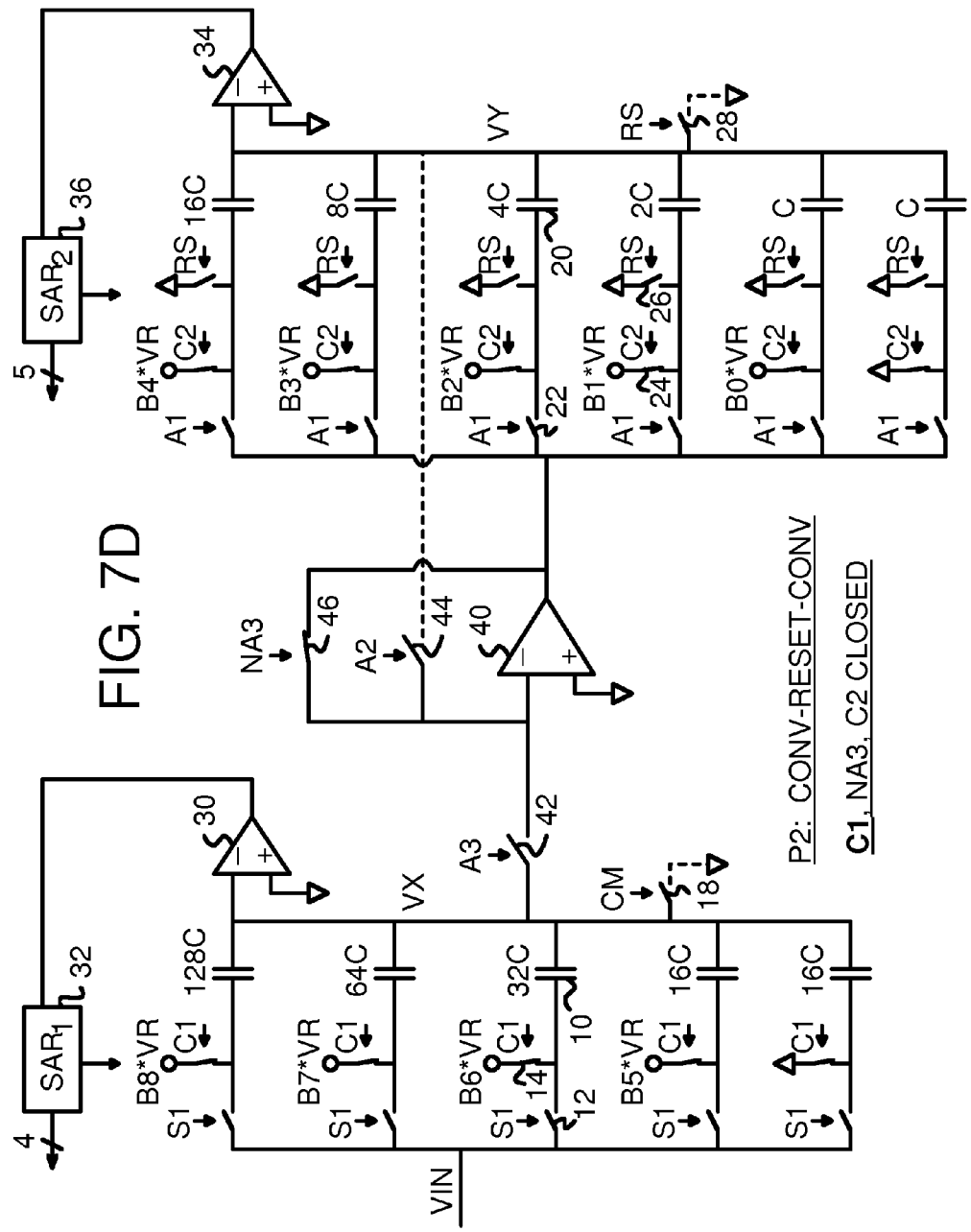

In FIG. 7D, phase 2, the first stage has finished sampling and begins conversion. Switches 14 close to connect ground to the least significant capacitor in first-stage switched capacitors 10, and the reference voltage VR to any capacitors having their bit (B8 to B5) activated by first-stage SAR 32. First-stage SAR 32 tests various values in a sequence, examining the compare result from comparator 30 for each combination of B8:B5 tested, similar to the sequence shown in FIG. 2. Once the values of B8:B5 have been determined by first-stage SAR 32, these values are applied through switches 14 and a residual voltage generated on node VX. This residual voltage represents the error or remainder of VIN once the MSB's B8:B5 are applied. First stage conversion may continue through FIGS. 7D-7E.

A similar process is performed in FIGS. 7A-7D by second-stage SAR 36 through switches 24 until comparator 34 finds a smallest error voltage on VY, and these values of B4:B0 are stored as the converted value's LSB's.

Figure 7E:
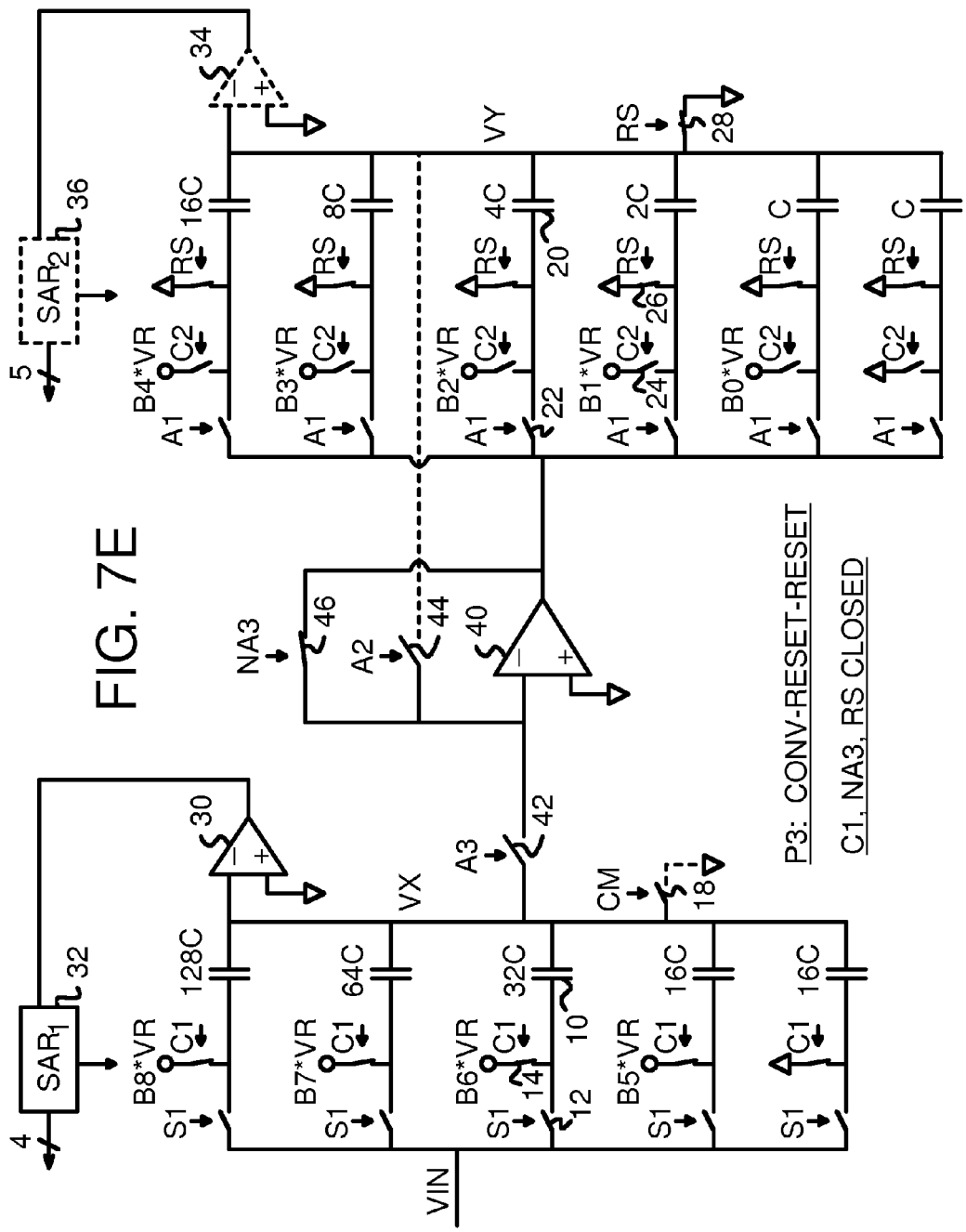

In FIG. 7E, second-stage conversion has finished. The values for B4:B0 are stored by second-stage SAR 36 or output and sent to other logic. Second-stage switched capacitors 20 are reset by switches 24 opening and reset switches 26, 28 closing. Both plates of second-stage switched capacitors 20 are grounded during this reset.

In FIG. 7F, amplification is performed by op amp 40. First-stage SAR 32 has completed conversion and B8:B5 are stored and applied through switches 14 to selectively drive the front plates of first-stage switched capacitors 10 with VR or ground. A residual voltage is generated on VX, and passes through switch 42 to the inverting input of op amp 40. Charge is shared between first-stage switched capacitors 10 and the op-amp input capacitance.

Switches 42, 44 close and zeroing switch 46 opens. Any error offset stored on the op-amp input capacitance is added to the charge shared from first-stage switched capacitors 10 and amplified by op amp 40 to generate its output.

The closing of feedback switch 44 connects the back plates of second-stage switched capacitors 20, summing node VY, to the input of op amp 40. Reset switches 26, 28 turn off, floating both plates of second-stage switched capacitors 20. Switches 24 remain off. However, switches 22 closes, connecting the front plates of second-stage switched capacitors 20 with the output of op amp 40. Thus second-stage switched capacitors 20 are connected between the input and output of op amp 40. Second-stage switched capacitors 20 act as a feedback capacitor.

The residual voltage from the first stage on first summing node VX is still amplified to generate the output voltage of op amp 40. The voltage gain is CS1/CS2, where CS1 is the total capacitance of first-stage switched capacitors 10 and CS2 is the total capacitance of second-stage switched capacitors 20. However, this output voltage is relative to ground, but neither plate of second-stage switched capacitors 20 is grounded. The output voltage of op amp 40 is an amplified result of the input residual voltage on node VX, but second-stage switched capacitors 20 is not grounded. There is no load capacitor that is grounded. However, charge is still transferred to second-stage switched capacitors 20 by op amp 40 amplifying the residual voltage from the first stage.

Figure 7I:
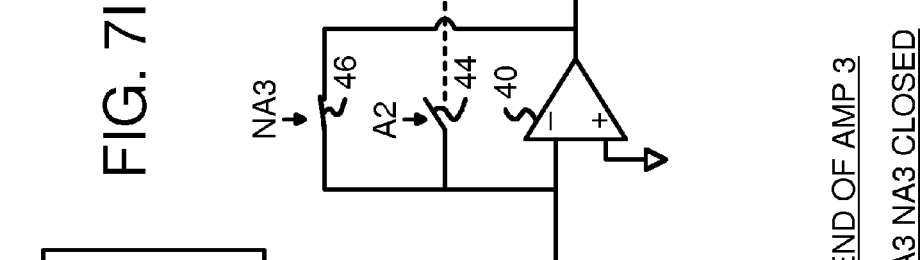
Figure 7I:
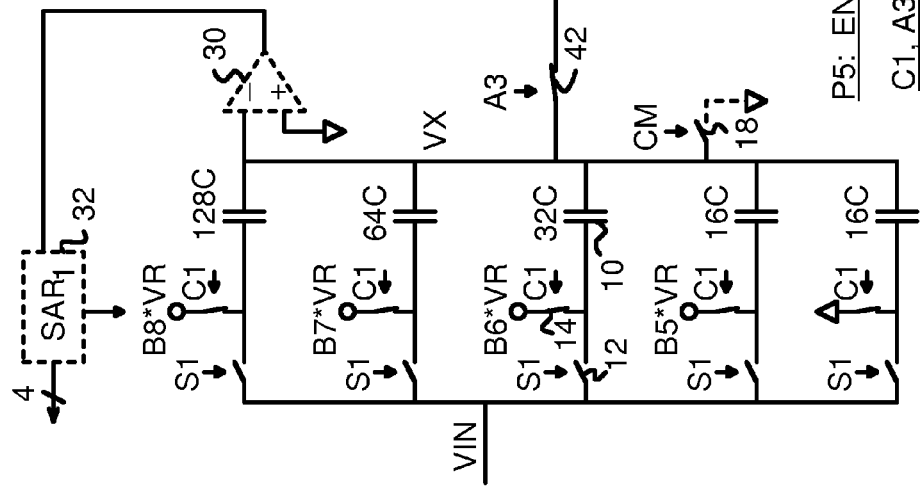

In FIG. 7G, the amplification phase is ending. Signal A1 falls first, opening switches 22 and floating the front plates of second-stage switched capacitors 20. Then in FIG. 7H, signal A2 goes low, opening feedback switch 44. The back plates of second-stage switched capacitors 20 also float. In FIG. 7I, signal NA3 goes high, closing zeroing switch 46. The amplifying phase has ended and op amp 40 is again being reset. Stage two is isolated form stage 1. The phases may now repeat from phase 1 (FIG. 7A).

The analog voltage being converted may be pipelined. The analog voltage VIN that was sampled in FIG. 7A, converted in stage 1 in FIGS. 7D-E, and amplified and stored on second-stage switched capacitors 20 in FIG. 7F, may now be converted by second-stage SAR 36 during a subsequent FIG. 7A. Thus the second stage does not convert an analog voltage that was converted by the first stage until all phases of FIGS. 7A-7I are completed. The second stage is converting a different analog voltage than the first stage during FIGS. 7A-7D, an analog voltage that was already converted by the first stage. Thus the first and second stage conversion operations are pipelined.

Figure 8:
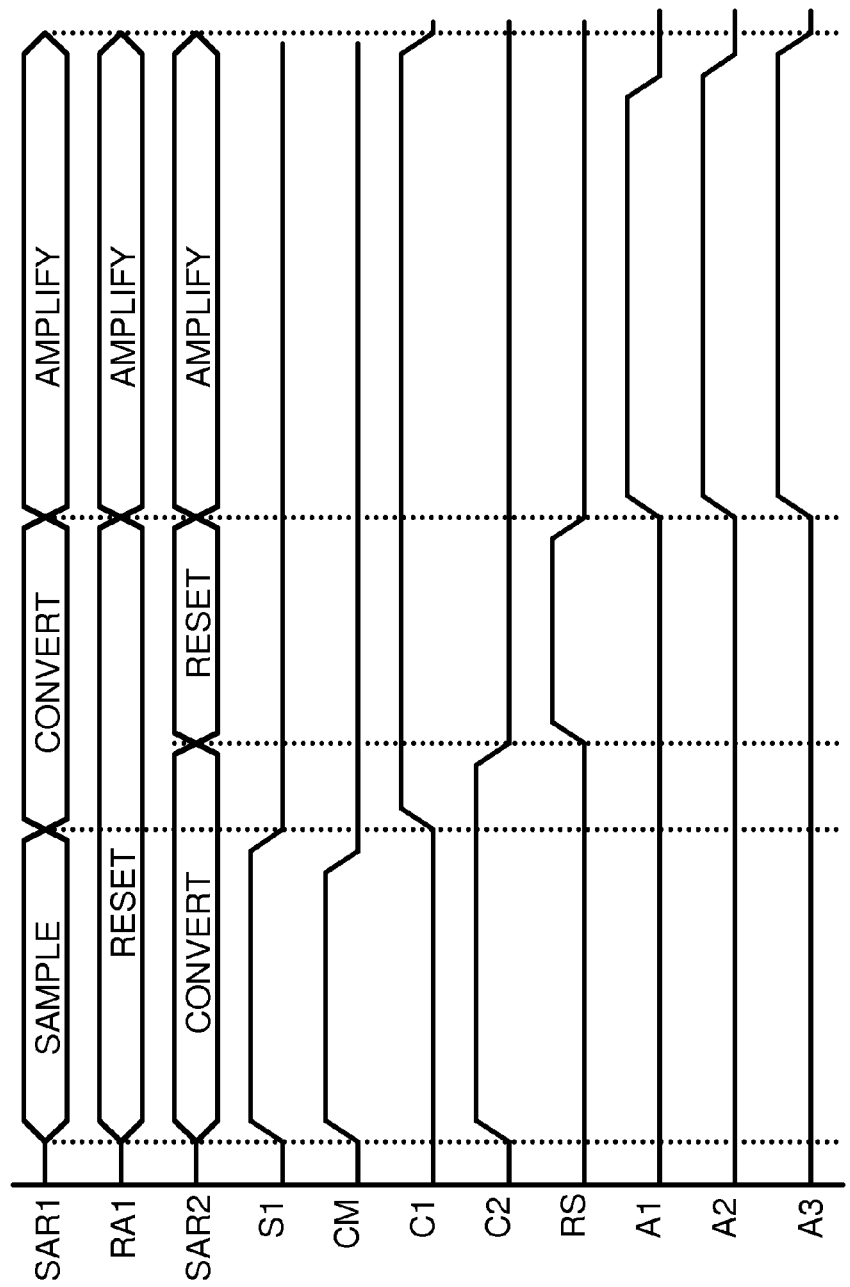
FIG. 8 is a waveform diagram of operation of the two-stage SAR-assisted pipeline ADC with loading-free residue transfer.

FIG. 8 is a waveform diagram of operation of the two-stage SAR-assisted pipeline ADC with loading-free residue transfer. An analog voltage VIN is initially sampled by the first-stage SAR-ADC (SAR1) by signal S1 going high (FIG. 7A). Grounding switch 18 opens (FIG. 7B) just before S1 ends (FIG. 7C). Signal C1 is low during sampling but goes high at the end of sampling and stays high during the conversion and amplify phases of the first stage SAR1.

Signals A1, A2, A3 are all low while op amp 40 (RA1) is being reset and zeroed. Signals A1, A2, A3 go high during the amplify phase.

The second stage, SAR2, performs conversion while signal C2 is high. After conversion of SAR2, C2 goes low and reset RS goes high to reset the second stage. Both sides of second-stage switched capacitors 20 are grounded during reset of SAR2. During amplification, stage 1 is connected to stage 2, and signals S1, CM, C2, and RS are all low. Signal C1 remains high during amplify so that first-stage SAR 32 can drive the converted binary values onto the front plates of first-stage switched capacitors 10 to drive the residual voltage to the input of op amp 40. In the next SAR2 conversion (not shown) this residual value is converted by SAR2. SAR2 is converting an older value than SAR1 is since they are pipelined.

Figure 9:
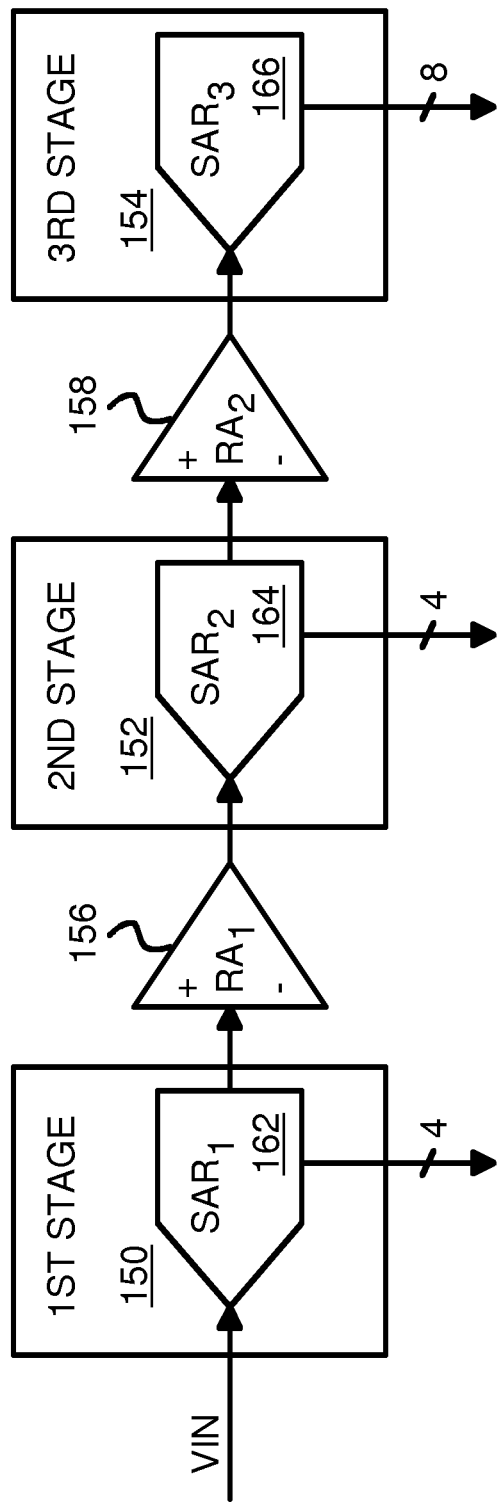
FIG. 9 shows a three-stage SAR-assisted pipeline ADC with loading-free residual transfer between stages.

FIG. 9 shows a three-stage SAR-assisted pipeline ADC with loading-free residual transfer between stages. First stage 150 uses first-stage SAR-ADC 162 to convert 4 bits, the MSB's. The residual voltage is applied to first residual amplifier 156 while the second-stage switched capacitors in second-stage SAR-ADC 164 are connected as the feedback capacitor, while no load capacitor is present. SAR-ADC 164 in second stage 152 then converts the residual voltage into four more binary bits. The operation of first stage 150 and second stage 152 and first residual amplifier 156 are as described before for FIGS. 6-8.

The residual voltage from second stage 152 (such as on second summing node VY of FIG. 6) can be input to second residual amplifier 158, which uses the third-stage switched capacitors in third-stage SAR-ADC 166 as the feedback capacitor, with no load capacitor present. Then third-stage SAR-ADC 166 converts this residual voltage to the final 8 bits.

Additional stages could be added, and different numbers of converted bits for each stage could be used. Some stages could be standard stages rather than no-load stages.

Figure 10:
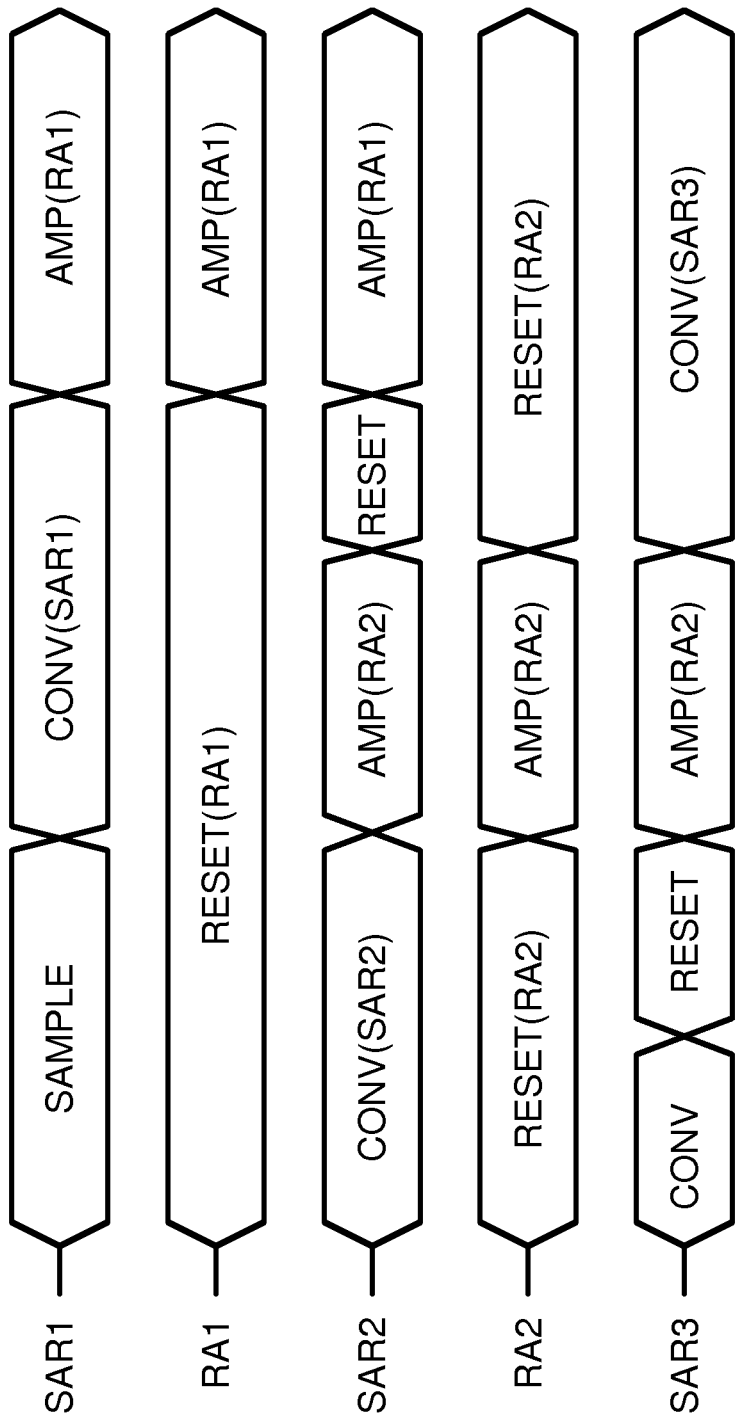
FIG. 10 shows operation of the three-stage SAR-assisted pipeline ADC of FIG. 9.

FIG. 10 shows operation of the three-stage SAR-assisted pipeline ADC of FIG. 9. First-stage SAR-ADC 162 (SAR1) samples the input while second-stage SAR-ADC 164 (SAR2) is converting the prior-sampled input that was transferred through first residual amplifier 156 (RA1) in a prior cycle. Third-stage SAR-ADC 166 (SAR3) is converting the prior-sampled input that was transferred through first and second residual amplifiers (RA1, RA2) in two prior cycles. SAR1 is converting the most recent VIN, SAR2 is converting the next-most-recent VIN sampled one cycle ago, and SAR3 is converting an older VIN from 3 cycles ago. Only one cycle is shown in FIG. 10.

Once SAR3 has finished conversion and saved the result, SAR3 is reset. Then SAR2 finishes conversion and saves its result, and the second amplifier RA2 is turns on to amplify and transfer the residual voltage from SAR2 to SAR3.

SAR2 and SAR3 are each reset before the amplify phase for the amplifier that inputs the amplified residual to that stage. For SAR2, after conversion, the next amplifier RA2 and the next stage SAR3 enter the RA2 amplify phase together. Then SAR2 is reset and receives the residual from first-stage SAR1 through first amplifier RA1, so SAR1, RA1, and SAR2 all enter the amplify stage together. Then SAR2 can convert the transferred residual.

For final stage SAR3, the final digital value bits are stored when the conversion phase ends, and combined with the best-fit (lowest error) digital bits determined by SAR2 in the prior cycle, and by SAR1 two cycles earlier. Once the final digital value from SAR3 is stored, SAR3 can be reset and then the amplification phase occurs for RA2, SAR2, and SAR3. The next conversion for SAR3 occurs once RA2 amplification completes. The residual voltage of SAR2 is amplified after conversion, but the residual voltage of SAR3 is not needed since there are not further stages to transfer a residual voltage to, so SAR3 can transition directly from conversion to reset without an amplify stage in between conversion and reset phases.

The two residual amplifiers RA1, RA2 are reset and zeroed when their respective amplification phase is not active.

ALTERNATE EMBODIMENTS

Several other embodiments are contemplated by the inventors. For example a fully differential ADC may be substituted. A second, complementary set of first-stage switched capacitors 10, using a second set of switches 12, 14, 18, drive a complementary node VX' and sample a complementary differential input VIN'. The inverting input of comparator 30 is driven by VX' rather than ground. A similar complementary set of second-stage switched capacitors 20 with switches 22, 24, 26, 28 could drive a complementary summing node VY' which drives the second input to comparator 34 instead of ground. The second input of op amp 40 could be driven through another switch 42 from VX', and feedback switch 44 and zeroing switch 46 duplicated for a second differential output from op amp 40. Equalizing switches could be added between true and complementary nodes for reset and equalization.

Calibration hardware and routines may be added. The second-stage switched capacitors used as the feedback capacitor may be used with other kinds of converters, such as flash ADC's, SAR-flash-assisted pipeline or multibit ADC's, and various other combinations and variations. ADC's may be interleaved, and sub-ADC/DAC's may be used or added. Other circuits using switched capacitors may incorporate the invention, such as a switched-capacitor programmable-gain residue amplifier.

For example rather than have a fully binary-weighted capacitor array, a combination of a binary-weighted capacitor array and a non-weighted capacitor array in two different stages can provide a desired resolution while still reducing total capacitance and dynamic power. While an application in a SAR ADC has been described, the circuit and calibration steps may be used for other applications and systems.

Rather than have a separate phase for certain signals, such as to open or close the grounding switches, the phase could be combined with another phase, so that grounding switches open at the same time that the digital values or some other signals are changed. This embodiment may be less immune to noise but is simpler from a control standpoint.

The number of bits in a binary-weighted capacitor array may be adjusted. For example, a 15 bit ADC could have 9 capacitors and 7 capacitors in the first and second stage arrays. The smallest capacitors in first-stage switched capacitors 10 and second-stage switched capacitors 20 do not have to be the same values, but could differ, such as 16C being used for the smallest capacitor in first-stage switched capacitors 10 while C being the smallest capacitor in second-stage switched capacitors 20, or vice-versa. The ratio of smallest capacitance values between the first and second stage is 16:1 in the example of FIGS. 4-7. But a 14:1 ratio, 7:1 ratio, 19:1 ratio, or some other ratio could be substituted. This ratio affects the gain of the residual voltage amplification, which is determined by the ratio of the total capacitance of all capacitors in first-stage switched capacitors 10 to the total capacitance of all capacitors in second-stage switched capacitors 20.

Additional capacitor arrays could be added, such as for differential inputs to comparator 30, rather than have ground applied to the non-inverting input. A fixed or reference voltage other than ground could be applied to the non-inverting input of op amp 40 or comparators 30, 34.

Both differential and single-ended analog voltages may be converted. A single-ended analog voltage may be applied to one differential input, while a reference voltage is applied to the other differential input.

The binary-weighted capacitor array could be thermometer-weighted or use gray codes or some other weighting arrangement. The binary bits from first-stage SAR 32 or second-stage SAR 36 can be merged with other control or timing information, such as from control logic or a sequencer or multi-phase non-overlapping clock.

A different number of bits could be substituted for a different precision, and the number of bits could be fixed or could be variable.

Some embodiments may not use all components. For example, switches may be added or deleted in some embodiments. Different kinds of switches may be used, such as 2-way switches or 3-way switches. Muxes may be used as switches. Input resistors could be added to VIN or more complex input filters used. Multiple levels of switches may be used, such as 2-way switches for switches, and then an overall switch that connects either VDD or GND to these 2-way switches.

While binary-weighted capacitors have been described, other weightings could be substituted, such as decimally-weighted capacitors, prime-weighted capacitors, or linearly-weighted capacitors, or octal-weighted capacitors. The digital value could be in these other number systems, such as octal numbers rather than binary numbers.

Inversions may be added by swapping inverting and non-inverting inputs as desired, but do not change the overall function and thus may be considered equivalents. The digital values that pass through the switches during the conversion phase could be applied directly to the switches as either data that passes through the switches or as control of the switches. More complex switches could use the digital values to generate high and low voltages that are applied to the capacitors by the complex switches. Other embodiments of connecting the digital values to the capacitors through the switches are possible.

The resistance and capacitance values may vary in different patterns. Capacitors, resistors, and other filter elements may be added. Switches could be n-channel transistors, p-channel transistors, or transmission gates with parallel n-channel and p-channel transistors, or more complex circuits, either passive or active, amplifying or non-amplifying.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation.

Inversions may be added, or extra buffering. The final sizes of transistors and capacitors may be selected after circuit simulation or field testing. Metal-mask options or other programmable components may be used to select the final capacitor, resistor, or transistor sizes. Capacitors may be connected together in parallel to create larger capacitors that have the same fringing or perimeter effects across several capacitor sizes.

Comparison of a reference voltage to a single analog voltage could be used, or a differential analog voltage could be compared. The differential input voltage could be latched and then the latched single-ended voltage compared to the summing node voltage. The first voltage could be sampled by a capacitor; then the second voltage could be sampled by the same capacitor. The differential charge is stored on another capacitor through the feedback of the amplifier. Another method for comparing differential analog voltages is to put a differential amplifier at the input with a defined gain. While an operational amplifier (op amp) could be used, other kinds of comparators could be used, such as non-amplifying compare buffers.

An equalizing switch could be added. Two grounding switches could be used on the true and complement inputs lines of the inputs to comparator. Rather than grounding, some switches could connect to another fixed voltage, such as VDD or VDD/2. Ground and the reference voltage could be reversed in some circuits, and various power schemes used. The reference voltage could be below ground, or ground used as the reference and a negative voltage used in place of ground.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A load-less two-stage Successive-Approximation Register (SAR) assisted pipeline Analog-to-Digital Converter (ADC) comprising:
    a first stage which comprises:
        an analog input for receiving an analog voltage for conversion to a digital value that represents the analog voltage;
        a first Successive-Approximation Register (SAR) for storing and adjusting a first portion of the digital value;
        a first comparator having an input connected to a first summing node and an output applied to the first Successive-Approximation Register (SAR), wherein the first SAR adjusts the first portion of the digital value in response to the output from the first comparator during conversion;
        a plurality of sampling switches connected between the analog input and a plurality of first internal nodes;
        first-stage switched capacitors having weighted capacitance values, each first-stage switched capacitor connected between the first summing node and one of the plurality of first internal nodes;
        a plurality of first controllable switches, each connected to one of the plurality of first internal nodes, each for connecting one of the plurality of first internal nodes to a reference voltage or to a fixed voltage in response to a bit in the first portion of the digital value received from the first SAR;
    a second stage which comprises:
        a second Successive-Approximation Register (SAR) for storing and adjusting a second portion of the digital value;
        a second comparator having an input connected to a second summing node and an output applied to the second Successive-Approximation Register (SAR), wherein the second SAR adjusts the second portion of the digital value in response to the output from the second comparator during a second conversion phase;
        a plurality of connecting switches connected between an amplifier output node and a plurality of second internal nodes;
        second-stage switched capacitors having weighted capacitance values, each second-stage switched capacitor connected between the second summing node and one of the plurality of second internal nodes;
        a plurality of second controllable switches, each connected to one of the plurality of second internal nodes, each for connecting one of the plurality of second internal nodes to the reference voltage or to the fixed voltage in response to a bit in the second portion of the digital value received from the second SAR;
    a connecting amplifier which comprises:
        an op amp having a first input and an amplifier output node;
        an amplifier input switch that connects the first summing node to the first input of the op amp to pass a residual voltage from the first stage to the op amp during an amplification phase;
        a zeroing switch that connects the amplifier output node to the first input to reset the op amp when the amplification phase is not active; and
        a feedback switch that connects the first input to the second summing node to cause the second-stage switched capacitors to act as a feedback capacitor for the op amp during the amplification phase when the plurality of connecting switches connect the amplifier output node to the plurality of second internal nodes connected to the second-stage switched capacitors;
    wherein the second-stage switched capacitors act as the feedback capacitor for the op amp during the amplification phase and acts as switched capacitors during the second conversion phase;
    whereby the second-stage switched capacitors are used for op amp feedback and for binary conversion.

2. The load-less two-stage SAR-assisted pipeline ADC of claim 1 wherein both terminals of each of the second-stage switched capacitors connect through closed switches to the op amp during the amplification phase, wherein one terminal connects to the amplifier output node and another terminal connects to the first input of the op amp for each capacitor in the second-stage switched capacitors.

3. The load-less two-stage SAR-assisted pipeline ADC of claim 1 wherein the second-stage switched capacitors are disconnected from the fixed voltage during the amplification phase;
   wherein the amplifier output node is not connected to the fixed voltage by any capacitor during the amplification phase,
   whereby no amplifier load is present during the amplification phase.

4. The load-less two-stage SAR-assisted pipeline ADC of claim 1 further comprising:
   a plurality of reset switches, each connected to one of the plurality of second internal nodes, for resetting each second internal node to the fixed voltage during a second-stage reset phase;
   a second summing node reset switch for connecting the second summing node to the fixed voltage during a second-stage reset phase,
   wherein both terminals of each capacitor in the second-stage switched capacitors is connected to the fixed voltage during the second-stage reset phase.

5. The load-less two-stage SAR-assisted pipeline ADC of claim 4 further comprising:
   a first summing node reset switch for connecting the first summing node to the fixed voltage during a first-stage sampling phase.

6. The load-less two-stage SAR-assisted pipeline ADC of claim 1 further comprising:
   a second input to the op amp, the op amp comparing the first input to the second input to generate the amplifier output node;
   a first-stage second input to the first comparator, the first comparator comparing the first-stage second input to the first summing node to generate the output of the first comparator;
   a second-stage second input to the second comparator, the second comparator comparing the second-stage second input to the second summing node to generate the output of the second comparator;
   wherein the second input, the first-stage second input, and the second-stage second input are connected to the fixed voltage.

7. The load-less two-stage SAR-assisted pipeline ADC of claim 6 wherein the fixed voltage is a ground.

8. The load-less two-stage SAR-assisted pipeline ADC of claim 1 further comprising:
   a second input to the op amp, the op amp comparing the first input to the second input to generate the amplifier output node;
   a complementary output of the op amp;
   wherein the amplifier output node is a true output of the op amp;
   a first-stage second input to the first comparator, the first comparator comparing the first-stage second input to the first summing node to generate the output of the first comparator;
   a second-stage second input to the second comparator, the second comparator comparing the second-stage second input to the second summing node to generate the output of the second comparator;
   wherein the first-stage second input is a differential voltage from a complementary first summing node that connects to complementary first-stage switched capacitors sampled from a complement of the analog voltage, wherein the analog voltage is a true differential signal;
   wherein the second-stage second input is a differential voltage from a complementary second summing node that connects to complementary second-stage switched capacitors;
   wherein the second input to the op amp receives a differential voltage through a complementary amplifier input switch from the complementary first summing node.

9. The load-less two-stage SAR-assisted pipeline ADC of claim 1 further comprising:
   a second terminal capacitor in the second-stage switched capacitors, the second terminal capacitor having a minimum capacitance value, the second terminal capacitor connecting only to the fixed voltage and not connecting to the reference voltage at its second internal node;
   wherein capacitors other than the second terminal capacitor in the second-stage switched capacitors are binary-weighted having capacitance values that are in a sequence of increasing binary powers of two starting with the minimum capacitance value;
   wherein two capacitors in the second-stage switched capacitors have the minimum capacitance value.

10. The load-less two-stage SAR-assisted pipeline ADC of claim 1 further comprising:
   a phase sequencer for closing the plurality of sampling switches and the first summing node reset switch and for opening the first controllable switches during a sampling phase to sample the analog input;
   during the second conversion phase, opening the plurality of connecting switches and the plurality of reset switches and the second summing node reset switch and closing the plurality of second controllable switches and activating the second SAR to adjust values of the second portion of the digital value to convert a voltage of the second summing node;
   during a first conversion phase, closing the plurality of first controllable switches and opening the sampling switches and the first summing node reset switch, and activating the first SAR to adjust values of the first portion of the digital value to convert a voltage of the first summing node,
   when the amplification phase is not active, closing the zeroing switch to reset the op amp and opening the amplifier input switch and the feedback switch; and
   when the amplification phase is active, opening the zeroing switch and closing the amplifier input switch and the feedback switch to amplify the first summing node and to use the second-stage switched capacitors as the feedback capacitor for the op amp.

11. The load-less two-stage SAR-assisted pipeline ADC of claim 10 wherein the first conversion phase and the second conversion phase overlap in time, wherein the second portion of the digital value being generated by the second SAR is for an older sample of the analog input than the first portion of the digital value being generated by the first SAR,
   whereby SAR conversions are pipelined.

12. The load-less two-stage SAR-assisted pipeline ADC of claim 1 wherein the first portion of the digital value comprises M bits;
   wherein M is a whole number of at least 4;
   wherein the second portion of the digital value comprises K bits;
   wherein K is a whole number of at least 4;
   wherein the first-stage switched capacitors comprise M+1 capacitors;
   wherein the plurality of first controllable switches comprises M+1 switches;

wherein the plurality of first internal nodes comprises M+1 first internal nodes;
wherein the plurality of sampling switches comprises M+1 switches;
wherein the second-stage switched capacitors comprise K+1 capacitors;
wherein the plurality of second controllable switches comprises K+1 switches;
wherein the plurality of second internal nodes comprises K+1 second internal nodes; and
wherein the plurality of connecting switches comprises K+1 switches.

13. A method to convert an analog voltage to a digital value comprising:
sampling the analog voltage through a plurality of sampling switches to charge first plates of first-stage switched capacitors while second plates of the first-stage switched capacitors are held at a fixed voltage;
converting a residue of a prior-sampled analog voltage using a second-stage Successive-Approximation Register (SAR) that alternately drives successive first plates of second-stage switched capacitors to a reference voltage or to the fixed voltage to test values of a lower digital value while comparing a second summing node of all second plates of the second-stage switched capacitors to a second compare voltage to determine an error; wherein the second-stage SAR finds a best lower digital value having a lowest error during a second-stage conversion phase;
resetting an amplifier by closing a zeroing switch to connect a first input of the amplifier to an amplifier output, and storing an error charge on an input capacitor on the first input;
disconnecting the second plates of the first-stage switched capacitors from the fixed voltage and opening the sampling switches to prepare for a first-stage conversion phase;
during the first-stage conversion phase, converting the analog voltage sampled onto the first-stage switched capacitors using a first-stage SAR that alternately drives successive first plates of first-stage switched capacitors to the reference voltage or to the fixed voltage to test values of an upper digital value while comparing a first summing node of all second plates of the first-stage switched capacitors to a first compare voltage to determine an error; wherein the first-stage SAR finds a best upper digital value having a lowest error;
resetting the second-stage switched capacitors after the best lower digital value is found by the second-stage SAR by connecting both the first plates and the second plates of the second-stage switched capacitors to the fixed voltage; and
amplifying a residue on the first summing node by opening the zeroing switch and closing an amplifier input switch to connect the first summing node to the first input of the amplifier, and closing a feedback switch to connect the first input of the amplifier to the second summing node while closing connecting switches that connect the amplifier output to the first plates of the second-stage switched capacitors,
wherein the second-stage switched capacitors are connected as a feedback capacitor between the first input of the amplifier and the amplifier output during amplification to store a residue on the second-stage switched capacitors for conversion to the lower digital value.

14. The method of claim 13 wherein the first compare voltage is a ground;
wherein the second compare voltage is the ground;
wherein the fixed voltage is the ground.

15. The method of claim 13 further comprising:
ending amplification by opening the connecting switches, then opening the feedback switch, before closing the zeroing switch.

16. The method of claim 13 wherein the first-stage conversion phase overlaps in time with the second-stage conversion phase, wherein second-stage conversion is pipelined with first-stage conversion;
wherein the best lower digital value generated by the second-stage SAR is combined with the best upper digital value previously generated by the first-stage SAR in an earlier cycle.

17. A multi-stage converter comprising:
a first Successive-Approximation Register (SAR) controlling upper bits of a digital value that are toggled to test various values of the upper bits;
a first comparator that compares a first summing node to generate a first error, wherein the first SAR finds upper bits that generate a lowest first error;
first-stage switched capacitors having front plates that are switched to a high voltage and to a low voltage in response to the upper bits of the digital value from the first SAR, and having back plates connected to the first summing node;
sampling switches that connect an analog input voltage to the front plates of the first-stage switched capacitors during a sampling phase;
an amplifier input switch that connects the first summing node to an amplifier input node;
a zeroing switch that connects the amplifier input node to an amplifier output node;
an amplifier having the amplifier input node as an input, and the amplifier output node as an output;
a second SAR controlling lower bits of the digital value that are toggled to test various values of the lower bits;
a second comparator that compares a second summing node to generate a second error, wherein the second SAR finds lower bits that generate a lowest second error;
second-stage switched capacitors having front plates that are switched to a high voltage and to a low voltage in response to the lower bits of the digital value from the second SAR, and having back plates connected to the second summing node;
connecting switches that connect the amplifier output node to the front plates of the second-stage switched capacitors during an amplifying phase;
a feedback switch that connects the second summing node to the amplifier input node during the amplifying phase;
wherein the back plates of the second-stage switched capacitors are connected to the amplifier input node and the front plates of the second-stage switched capacitors are connected to the amplifier output node during amplification, wherein the second-stage switched capacitors act as feedback capacitors during the amplifying phase.

18. The multi-stage converter of claim 17 further comprising:
reset switches that drive the front plates and the back plates of the second-stage switched capacitors to ground during a second-capacitor reset phase before the amplifying phase.

19. The multi-stage converter of claim 18 further comprising:
phase means for opening and closing switches to reset the amplifier during the sampling phase, and to reset the amplifier when the second SAR is finding the lower bits having the lowest second error, and to reset the amplifier when the first SAR is finding the upper bits having the lowest first error, and to reset the amplifier during the second-capacitor reset phase, and to connect the first summing node to the amplifier input node and to connect the front plates of second-stage switched capacitors to the amplifier output node and to connect the back plates of the second-stage switched capacitors to the amplifier input node during the amplifying phase.

20. The multi-stage converter of claim 19 further comprising:

sequence means for activating the sampling phase, resetting the amplifier, and generating the lowest second error, then generating the lowest first error while resetting the amplifier, then activating the second-capacitor reset phase, then generating the amplifying phase and then repeating from the sampling phase.

\* \* \* \* \*